United States Patent
Liu et al.

(10) Patent No.: US 11,592,653 B2
(45) Date of Patent: Feb. 28, 2023

(54) AUTOMATED FOCUSING SYSTEM FOR TRACKING SPECIMEN SURFACE WITH A CONFIGURABLE FOCUS OFFSET

(71) Applicant: KLA Corporation, Milpitas, CA (US)

(72) Inventors: Xiumei Liu, Fremont, CA (US); Kai Cao, Fremont, CA (US); Richard Wallingford, San Jose, CA (US); Matthew Giusti, San Jose, CA (US); Brooke Bruguier, San Jose, CA (US)

(73) Assignee: KLA Corporation, Milpitas, CA (US)

( * ) Notice: Subject to any disclaimer, the term of this patent is extended or adjusted under 35 U.S.C. 154(b) by 191 days.

(21) Appl. No.: 16/836,787

(22) Filed: Mar. 31, 2020

(65) Prior Publication Data

US 2020/0319443 A1     Oct. 8, 2020

Related U.S. Application Data

(60) Provisional application No. 62/829,831, filed on Apr. 5, 2019.

(51) Int. Cl.
    *G02B 21/00*     (2006.01)
    *G02B 21/36*     (2006.01)

(52) U.S. Cl.
    CPC ......... *G02B 21/006* (2013.01); *G02B 21/364* (2013.01); *G02B 21/0032* (2013.01)

(58) Field of Classification Search
    CPC ................ G02B 21/006; G02B 21/364; G02B 21/0032; G02B 21/0004; G02B 21/002;
(Continued)

(56) References Cited

U.S. PATENT DOCUMENTS

| 4,639,587 A | 1/1987 | Chadwick et al. |
| 5,604,344 A | 2/1997 | Finarov |

(Continued)

FOREIGN PATENT DOCUMENTS

| JP | 2002057095 A | * | 2/2002 | |
| JP | 2004070276 A | * | 3/2004 | ........... G02B 21/245 |

(Continued)

OTHER PUBLICATIONS

International Search Report and Written Opinion dated Jul. 27, 2020 for PCT/US2020/026487.

*Primary Examiner* — Arnel C Lavarias
(74) *Attorney, Agent, or Firm* — Suiter Swantz pc llo

(57) ABSTRACT

An auto-focusing system is disclosed. The system includes an illumination source. The system includes an aperture. The system includes a projection mask. The system includes a detector assembly. The system includes a relay system, the relay system being configured to optically couple illumination transmitted through the projection mask to an imaging system. The relay system also being configured to project one or more patterns from the projection mask onto a specimen and transmit an image of the projection mask from the specimen to the detector assembly. The system includes a controller including one or more processors configured to execute a set of program instructions. The program instructions being configured to cause the one or more processors to: receive one or more images of the projection mask from the detector assembly and determine quality of the one or more images of the projection mask.

9 Claims, 25 Drawing Sheets

(58) Field of Classification Search
CPC .......... G02B 21/0052; G02B 21/0076; G02B 21/008; G02B 21/06; G02B 21/36; G02B 21/361; G02B 21/365; G02B 21/241; G02B 21/244; G02B 21/245; G02B 21/247; G02B 7/28; G02B 7/282; G02B 7/285; G02B 7/36
USPC ....... 359/368, 362, 363, 369, 385, 388, 434; 250/201.1, 201.2, 201.3
See application file for complete search history.

(56) References Cited

U.S. PATENT DOCUMENTS

| | | |
|---|---|---|
| 7,030,351 B2 | 4/2006 | Wasserman et al. |
| 2011/0017902 A1 | 1/2011 | Hing et al. |
| 2013/0093874 A1 | 4/2013 | Hulsken |

FOREIGN PATENT DOCUMENTS

| | | | |
|---|---|---|---|
| JP | 2012093581 A | * | 5/2012 |
| KR | 101667798 B1 | | 10/2016 |

\* cited by examiner

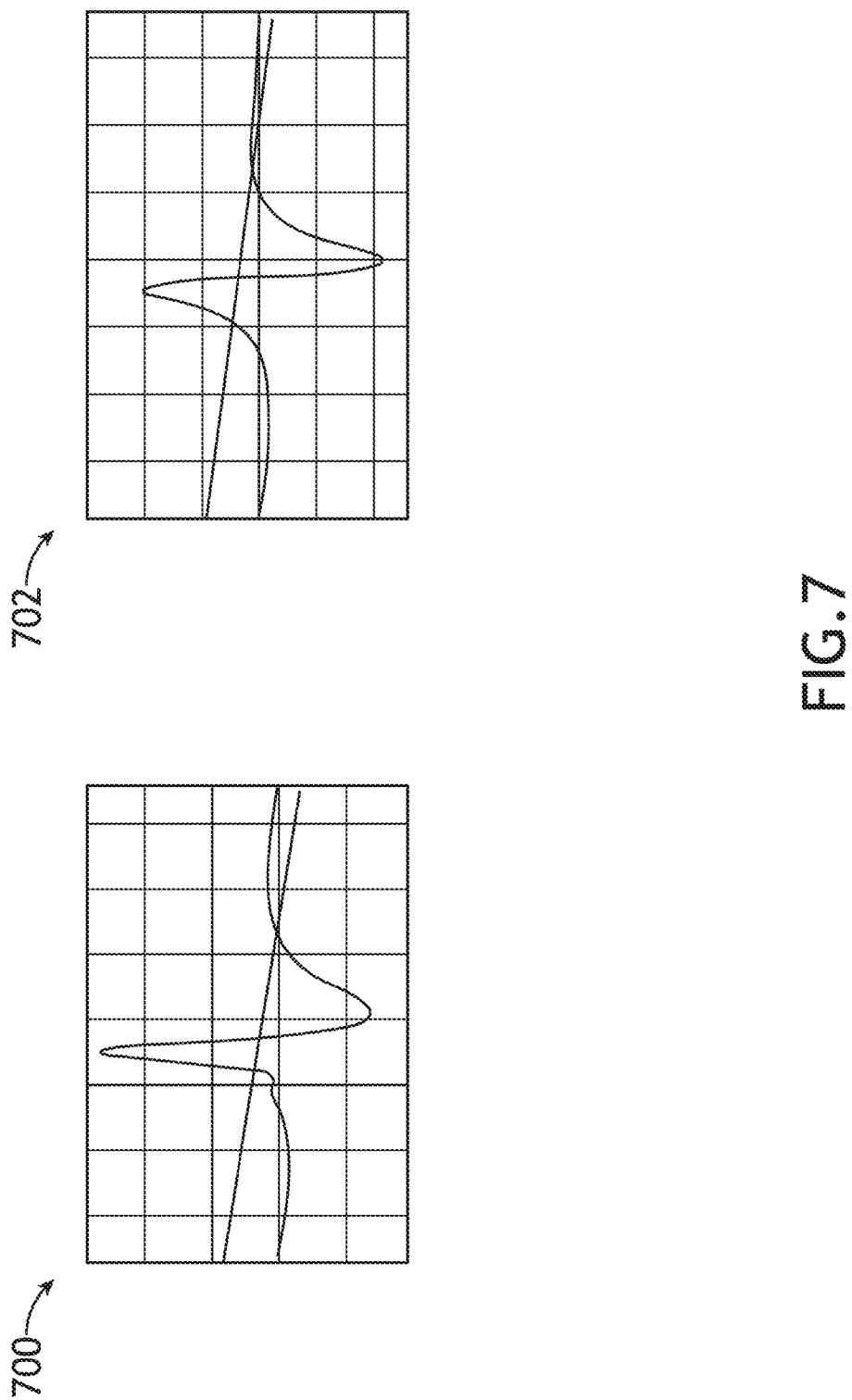

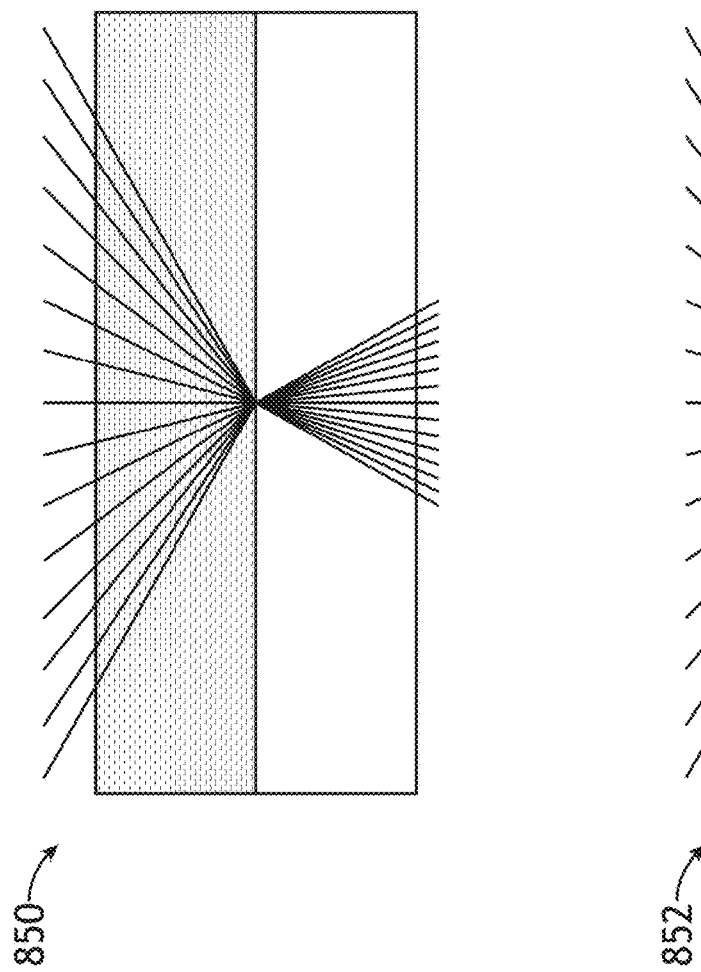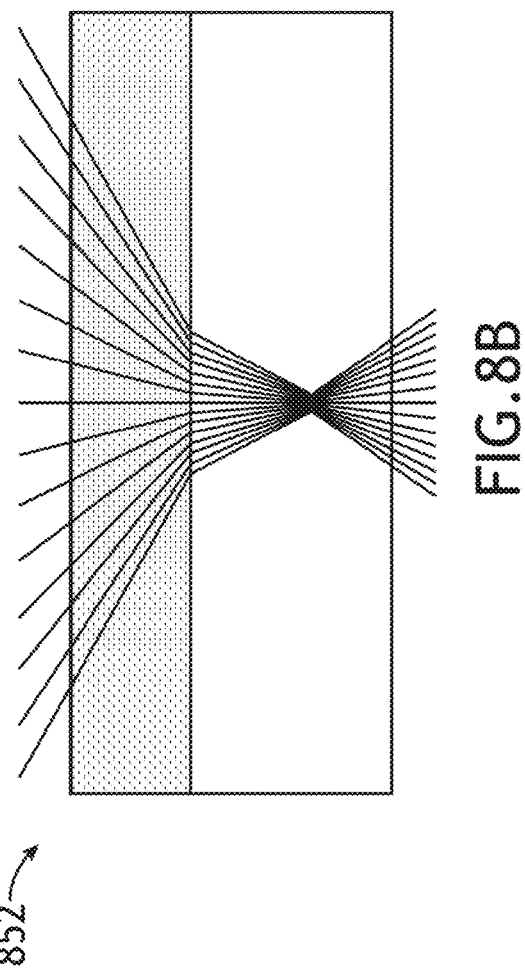
FIG. 8B

AUTOMATED FOCUSING SYSTEM FOR TRACKING SPECIMEN SURFACE WITH A CONFIGURABLE FOCUS OFFSET

CROSS-REFERENCE TO RELATED APPLICATION

The present application claims priority to U.S. Provisional Patent Application No. 62/829,831, filed Apr. 5, 2019, entitled AUTOMATED FOCUSING SYSTEM TRACKING SPECIMEN SURFACE WITH CONFIGURABLE FOCUS OFFSET, naming Xiumei Liu, Kai Cao, Richard Wallingford, Matthew Giusti, and Brooke Bruguier as inventors, which is incorporated herein by reference in the entirety.

TECHNICAL FIELD

The present invention generally relates to the field of optical imaging systems and, more particularly, to an automated focusing system for tracking specimen surface with a configurable focus offset.

BACKGROUND

Demand for electronic logic and memory devices with ever-smaller footprints and features present a wide range of manufacturing challenges beyond fabrication at a desired scale. In the context of semiconductor fabrication, accurately identifying the type and size of defects is an important step in improving throughput and yield. Further, in order to achieve the best imaging quality and defect detection sensitivity, the focal plane of the imaging system must be maintained.

Therefore, it would be desirable to provide a system that cures one or more of the shortfalls of the previous approaches identified above.

SUMMARY

An auto-focusing system is disclosed. In one embodiment, the system includes an illumination source. In another embodiment, the system includes an aperture. In another embodiment, the system includes a projection mask. In another embodiment, the system includes a detector assembly. In another embodiment, the system includes a relay system, the relay system being configured to optically couple illumination transmitted through the projection mask to an imaging system, the relay system being configured to project one or more patterns from the projection mask onto a specimen disposed on a stage assembly of the imaging system and transmit an image of the projection mask from the specimen to the detector assembly. In another embodiment, the system includes a controller including one or more processors, the one or more processors being configured to execute a set of program instructions stored in memory, the program instructions being configured to cause the one or more processors to: receive one or more images of the projection mask from the detector assembly; and determine quality of the one or more images of the projection mask.

A system is disclosed. In one embodiment, the system includes an imaging system. In another embodiment, the system includes an auto-focusing system. In another embodiment, the auto-focusing system includes an illumination source. In another embodiment, the auto-focusing system includes an aperture. In another embodiment, the auto-focusing system includes a projection mask. In another embodiment, the auto-focusing system includes a detector assembly. In another embodiment, the auto-focusing system includes a relay system, the relay system being configured to optically couple illumination transmitted through the projection mask to the imaging system, the relay system being configured to project one or more patterns from the projection mask onto a specimen disposed on a stage assembly of the imaging system and transmit an image of the projection mask from the specimen to the detector assembly. In another embodiment, the system includes a controller including one or more processors, the one or more processors being configured to execute a set of program instructions stored in memory, the program instructions being configured to cause the one or more processors to: receive one or more images of the projection mask from the detector assembly; and determine quality of the one or more images of the projection mask.

An auto-focusing system is disclosed. In one embodiment, the auto-focusing system includes a projection mask image quality (PMIQ) auto-focusing system. In another embodiment, the PMIQ auto-focusing system includes an illumination source. In another embodiment, the PMIQ auto-focusing system includes a first aperture. In another embodiment, the PMIQ auto-focusing system includes a first projection mask. In another embodiment, the PMIQ auto-focusing system includes a first PMIQ detector assembly and a second PMIQ detector assembly. In another embodiment, the system includes a normalized s-curve (NSC) auto-focusing system. In another embodiment, the NSC auto-focusing system includes an illumination source. In another embodiment, the NSC auto-focusing system includes a second aperture. In another embodiment, the NSC auto-focusing system includes a second projection mask. In another embodiment, the NSC auto-focusing system includes a first NSC detector assembly and a second NSC detector assembly. In another embodiment, the system includes a relay system, the relay system being configured to optically couple illumination from the PMIQ autofocusing system and the NSC auto-focusing system to an imaging system, the relay system being configured to project one or more patterns from the first projection mask onto a specimen disposed on a stage assembly of the imaging system and transmit an image of the first projection mask from the specimen to the first PMIQ detector assembly and the second PMIQ detector assembly, the relay system being configured to project one or more patterns from the second projection mask onto the specimen disposed on the stage assembly of the imaging system and transmit an image of the second projection mask from the specimen to the first NSC detector assembly and the second NSC detector assembly. In another embodiment, the system includes a controller including one or more processors, the one or more processors being configured to execute a set of program instructions stored in memory, the program instructions being configured to cause the one or more processors to: receive one or more signals from the first PMIQ detector assembly, the second PMIQ detector assembly, the first NSC detector assembly, and the second NSC detector assembly; and execute a dual control loop based on the one or more signals from the first PMIQ detector assembly, the second PMIQ detector assembly, the first NSC detector assembly, and the second NSC detector assembly to adjust the stage assembly to maintain focus of the imaging system.

An auto-focusing system is disclosed. In one embodiment, the auto-focusing system includes a PMIQ auto-focusing system. In another embodiment, the PMIQ auto-focusing system includes an illumination source. In another embodiment, the PMIQ auto-focusing system includes a first aperture. In another embodiment, the PMIQ auto-focusing system includes a first projection mask. In another embodiment, the PMIQ auto-focusing system includes a first PMIQ detector assembly. In another embodiment, the system includes an NSC auto-focusing system. In another embodiment, the NSC auto-focusing system includes an illumination source. In another embodiment, the NSC auto-focusing system includes a second aperture. In another embodiment, the NSC auto-focusing system includes a second projection mask. In another embodiment, the NSC auto-focusing system includes a first NSC detector assembly. In another embodiment, the system includes a relay system, the relay system being configured to optically couple illumination from the PMIQ autofocusing system and the NSC auto-focusing system to an imaging system, the relay system being configured to project one or more patterns from the first projection mask onto a specimen disposed on a stage assembly of the imaging system and transmit an image of the first projection mask from the specimen to the first PMIQ detector assembly, the relay system being configured to project one or more patterns from the second projection mask onto the specimen disposed on the stage assembly of the imaging system and transmit an image of the second projection mask from the specimen to the first NSC detector assembly. In another embodiment, the system includes a controller including one or more processors, the one or more processors being configured to execute a set of program instructions stored in memory, the program instructions being configured to cause the one or more processors to: receive one or more signals from the first PMIQ detector assembly and the first NSC detector assembly; apply a digital binary return mask on the one or more signals from the first NSC detector assembly; and execute a dual control loop based on the one or more signals from the first PMIQ detector assembly, the first NSC detector assembly, and an output of the digital binary return mask to adjust the stage assembly to maintain focus of the imaging system.

An auto-focusing system is disclosed. In one embodiment, the auto-focusing system includes a PMIQ auto-focusing system. In another embodiment, the PMIQ auto-focusing system includes an illumination source. In another embodiment, the PMIQ auto-focusing system includes a first aperture. In another embodiment, the PMIQ auto-focusing system includes a tilted first projection mask. In another embodiment, the system includes an NSC auto-focusing system. In another embodiment, the NSC auto-focusing system includes an illumination source. In another embodiment, the NSC auto-focusing system includes a second aperture. In another embodiment, the NSC auto-focusing system includes a second projection mask. In another embodiment, the system includes a detector assembly. In another embodiment, the system includes a relay system, the relay system being configured to optically couple illumination from the PMIQ auto-focusing system and the NSC auto-focusing system to an imaging system, the relay system being configured to project one or more patterns from the first projection mask onto a specimen disposed on a stage assembly of the imaging system and transmit an image of the first projection mask from the specimen to the detector assembly, the relay system being configured to project one or more patterns from the second projection mask onto the specimen disposed on the stage assembly of the imaging system and transmit an image of the second projection mask from the specimen to the detector assembly. In another embodiment, the system includes a controller including one or more processors, the one or more processors being configured to execute a set of program instructions stored in memory, the program instructions being configured to cause the one or more processors to: receive one or more signals from the detector assembly; apply a digital binary return mask on the one or more signals from the detector assembly; and execute a dual control loop based on the one or more signals from the detector assembly and an output of the digital binary return mask to adjust the stage assembly to maintain focus of the imaging system.

An auto-focusing system is disclosed. In one embodiment, the auto-focusing system includes a PMIQ auto-focusing system. In another embodiment, the PMIQ auto-focusing system includes an illumination source. In another embodiment, the PMIQ auto-focusing system includes a first aperture. In another embodiment, the PMIQ auto-focusing system includes a first projection mask. In another embodiment, the PMIQ auto-focusing system includes one or more PMIQ detector assemblies. In another embodiment, the system includes an NSC auto-focusing system. In another embodiment, the NSC auto-focusing system includes an illumination source. In another embodiment, the NSC auto-focusing system includes a second aperture. In another embodiment, the NSC auto-focusing system includes a second projection mask. In another embodiment, the NSC auto-focusing system includes one or more NSC detector assemblies. In another embodiment, the system includes a relay system, the relay system being configured to optically couple illumination from the PMIQ autofocusing system and the NSC auto-focusing system to an imaging system, the relay system being configured to project one or more patterns from the first projection mask onto a specimen disposed on a stage assembly of the imaging system and transmit an image of the first projection mask from the specimen to the one or more PMIQ detector assemblies, the relay system being configured to project one or more patterns from the second projection mask onto the specimen disposed on the stage assembly of the imaging system and transmit an image of the second projection mask from the specimen to the one or more NSC detector assemblies. In another embodiment, the system includes a controller including one or more processors, the one or more processors being configured to execute a set of program instructions stored in memory, the program instructions being configured to cause the one or more processors to: receive one or more signals from the one or more PMIQ detector assemblies and the one or more NSC detector assemblies; and generate a focus error map based on the one or more signals from at least one of the one or more PMIQ detector assemblies or the one or more NSC detector assemblies.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which:

FIG. 7 illustrates a plot including a skewed and asymmetrical s-curve and a symmetrical s-curve, in accordance with one or more embodiments of the present disclosure.

FIG. 8B illustrates AF light patterns of the AF system, in accordance with one or more embodiments of the present disclosure.

DETAILED DESCRIPTION

The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Reference will now be made in detail to the subject matter disclosed, which is illustrated in the accompanying drawings.

Figure 1:
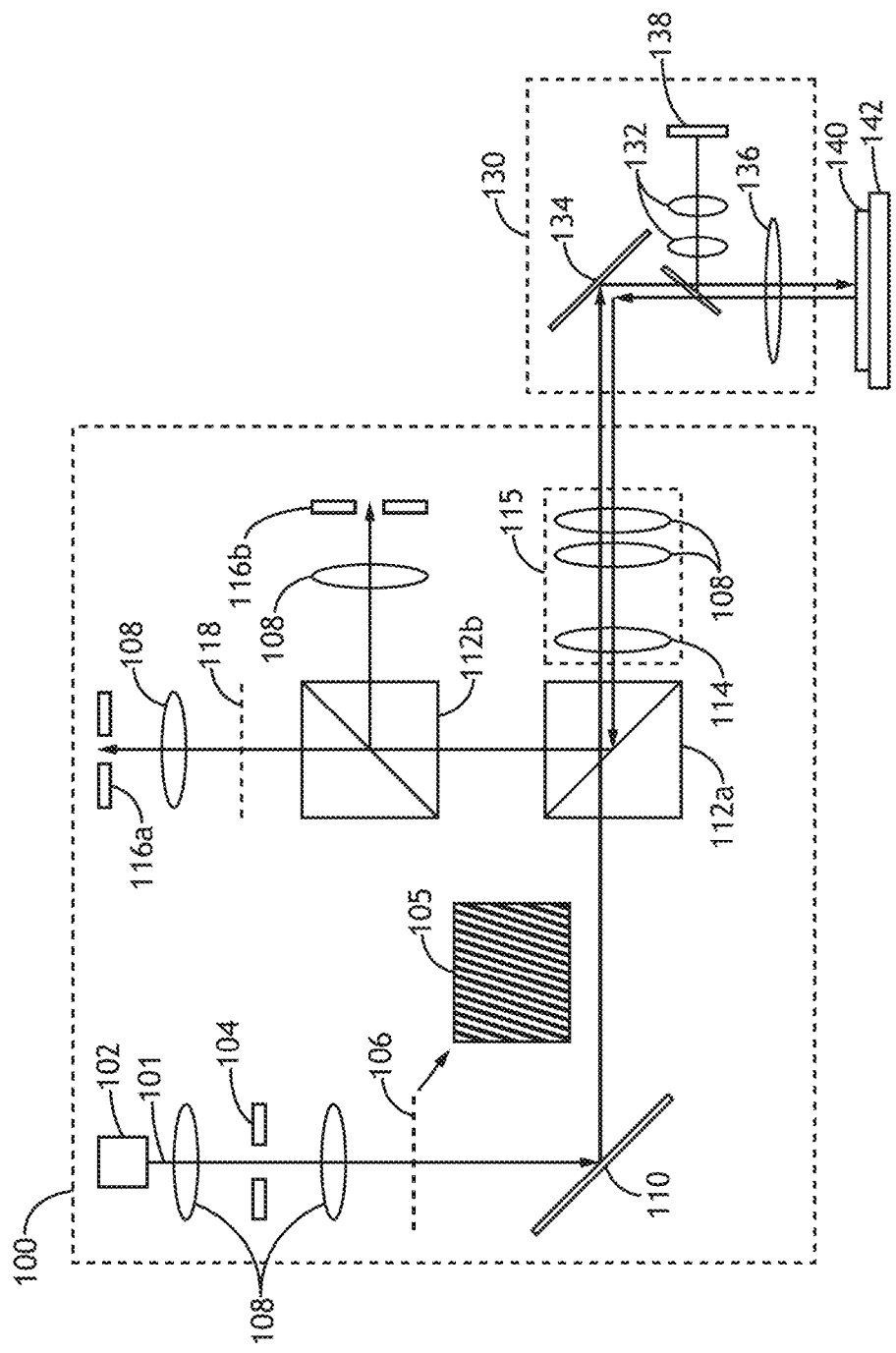
FIG. 1 illustrates a simplified schematic view of a conventional auto-focus (AF) system, in accordance with one or more embodiments of the present disclosure.

FIG. 1 illustrates a simplified schematic view of a conventional auto-focusing (AF) system 100 coupled to an imaging system 130, in accordance with one or more embodiments of the present disclosure. In one embodiment, the AF system 100 is coupled to an imaging system 130 via a relay system 115.

In one embodiment, the AF system 100 includes an illumination source 102 configured to generate illumination 101. The illumination source 102 may include any illumination source known in the art for generating illumination 101 including, but not limited to, a broadband radiation source, a narrowband radiation source, or the like.

In another embodiment, the AF system 100 includes an aperture 104. For example, the AF system 100 may include a pupil aperture 104. The aperture may have any numerical aperture value known in the art. For example, the pupil aperture 104 may have a numerical aperture of 0.9 NA.

In another embodiment, the AF system 100 includes a projection mask 106 configured to project a geometric pattern 105.

The relay system 115 may include any set of optical elements known in the art for relaying illumination. For example, the relay system 115 may include, but is not limited to, a focusing lens 114. For instance, the focusing lens 114 may include a z-adjustable focusing lens 114.

In another embodiment, the AF system 100 includes one or more sets of sensors 116. For example, the AF system 100 may include a first set of sensors 116a and a second set of sensors 116b. For instance, the first set of sensors 116a may be a set of focus sensors 116a and the second set of sensors 116b may be a set of normal sensors 116b.

In another embodiment, the AF system 100 includes a return mask 118.

The AF system 100 may include optical elements 108 known in the art. For example, the one or more optical elements 108 may include, but are not limited to, one or more mirrors 110, one or more beam splitters 112a, 112b, and the like. In addition, the AF system 100 may include any additional optical elements known in the art including, but not limited to, one or more mirrors, one or more lenses, one or more polarizers, one or more beam splitters, one or more wave plates, and the like.

The imaging system 130 may include one or more optical elements 132 including, but not limited to, one or more mirrors 134, one or more objective lenses 136, and the like. It is noted herein that the one or more optical elements 132 may include any optical elements known in the art including, but not limited to, one or more mirrors, one or more lenses, one or more polarizers, one or more beam splitters, one or more wave plates, and the like.

In another embodiment, the imaging system 130 includes one or more detectors 138 configured to acquire illumination from specimen 140 via the illumination source 102 or a separate independent light source (not shown in FIG. 1).

Specimen 140 may include any specimen known in the art including, but not limited to, a wafer, a reticle, a photomask, and the like; a biological specimen such as, but not limited to, tissue, phantom, or the like; or a non-biological specimen such as, but not limited to, one or more curved glass plates (or slabs), one or more non-curved glass plates (or slabs), or the like. In one embodiment, specimen 140 is disposed on a stage assembly 142 to facilitate movement of specimen 140. In another embodiment, the stage assembly 142 is an actuatable stage. For example, the stage assembly 142 may include, but is not limited to, one or more translational stages suitable for selectively translating the specimen 140 along one or more linear directions (e.g., x-direction, y-direction and/or z-direction). By way of another example, the stage assembly 142 may include, but is not limited to, one or more rotational stages suitable for selectively rotating the specimen 140 along a rotational direction. By way of another example, the stage assembly 142 may include, but is not limited to, a rotational stage and a translational stage suitable for selectively translating the specimen 140 along a linear direction and/or rotating the specimen 140 along a rotational direction.

A description of automated focusing systems are discussed in U.S. Pat. No. 4,639,587, issued Jan. 27, 1987, entitled AUTOMATIC FOCUSING SYSTEM FOR A MICROSCOPE, which is herein incorporated by reference in the entirety.

Figure 2A:
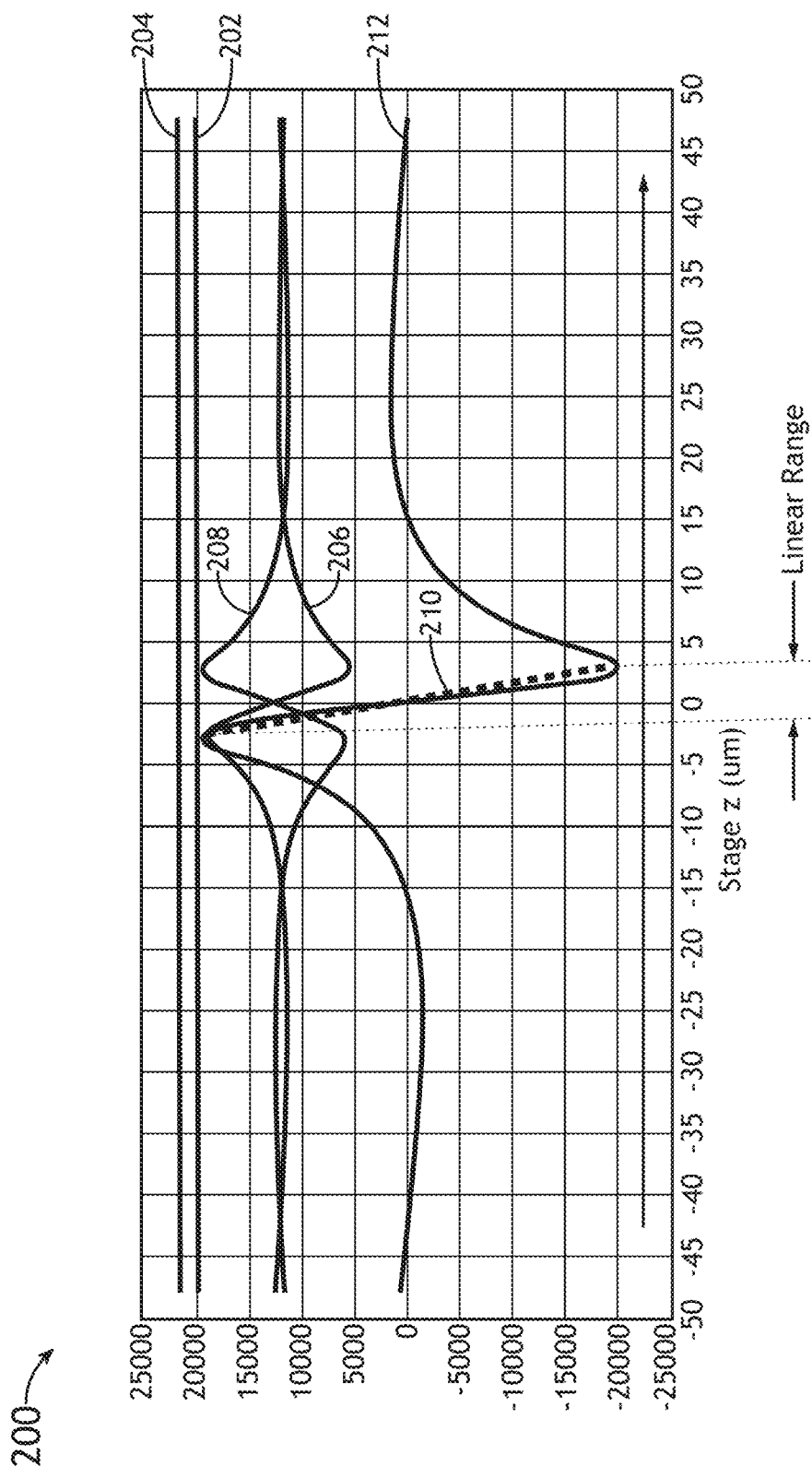
FIG. 2A illustrates a plot including a plurality of s-curves from the AF system, in accordance with one or more embodiments of the present disclosure.
Figure 2B:
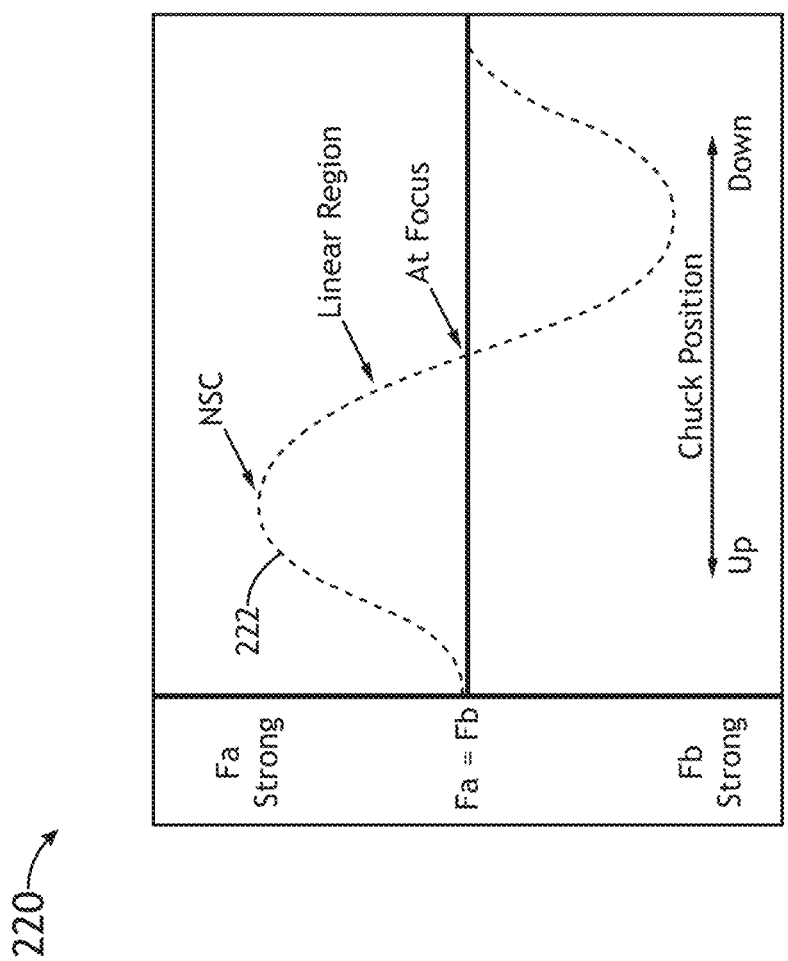
FIG. 2B is a normalized s-curve (NSC) plot, in accordance with one or more embodiments of the present disclosure.

FIG. 2A illustrates a plot 200 including a plurality of s-curves from the AF system 100, in accordance with one or more embodiments of the present disclosure. FIG. 2B illustrates a plot 220 of a normalized s-curve of the plurality of s-curves shown in FIG. 2A, in accordance with one or more embodiments of the present disclosure.

In one embodiment, the AF system 100 is configured to generate a plurality of s-curves. For example, as shown in FIG. 2A, the plurality of s-curves may include a normal channel A curve 202, a normal channel B curve 204, a focus channel A curve 206, a focus channel B curve 208, and a normalized s-curve (NSC) 212.

As shown in FIG. 2A, the linear range may be determined using the slope 210 of the curve 202.

In plot 220, a normalized s-curve (NSC) 222 is shown and described by:

$$NSC = \frac{Fa}{Na} - \frac{Fb}{Nb}$$

In Eqn. 1, $F_a$ represents the focus signals for Channel A, $F_b$ represents the focus signals for Channel B, $N_a$ represents the normal signals for Channel A, and $N_b$ represents the normal signals for Channel B. For example, the one or more normal signals ($N_a$, $N_b$) may be acquired from the normal sensor. By way of another example, the one or more focus signals may be acquired from the focus sensor.

It is noted herein that a control system may be designed in such a way to set the z-stage as NSC=0. However, a focusing lens with z-axis adjustments (e.g. focusing lens 114) is required to adjust a user configurable focus offset of the specimen's z-plane.

Figure 3:
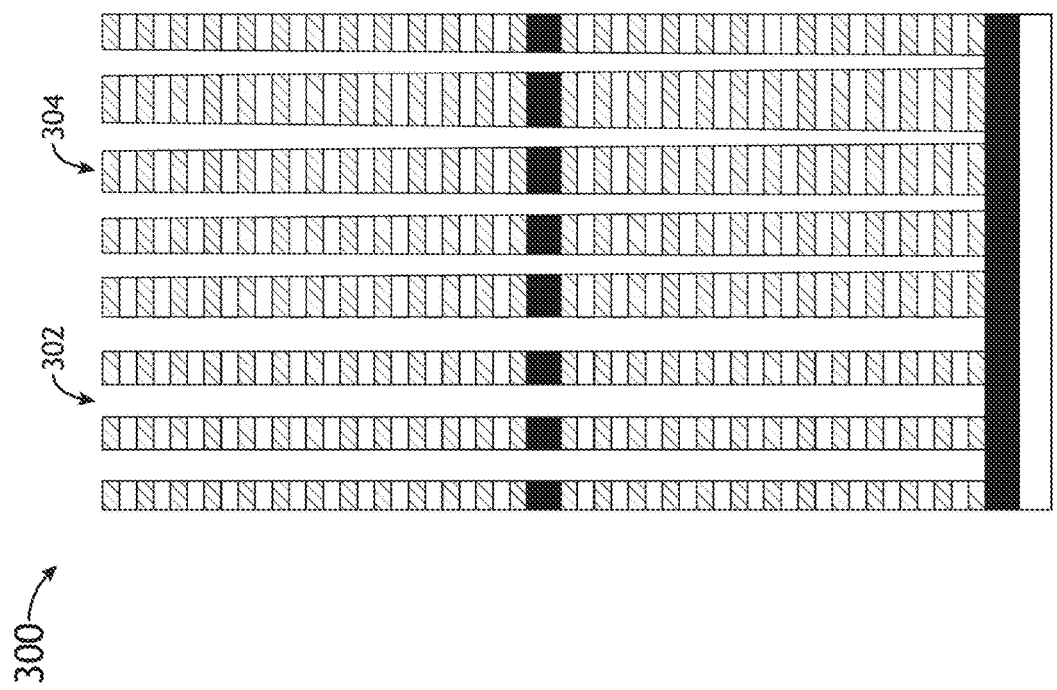
FIG. 3 illustrates a comparison of cross-sectional views of channel holes of a specimen, in accordance with one or more embodiments of the present disclosure.

FIG. 3 is a comparison 300 of desirable channel holes to misshaped channel holes through a specimen stack, in accordance with one or more embodiments of the present disclosure.

During a channel hole etch process step, a desirable channel hole (e.g., channel holes 302) should be cylindrical through a specimen stack (as shown by FIG. 3). The AF system 100 may maintain focus at required focus offset if specimen has uniform straight channel holes 302 throughout the entire specimen surface. However, it is noted herein that one or more process variations of the specimen may cause the AF system 100 to shift the specimen surface up and/or down. As shown in FIG. 3, this shift is caused by the tapered channel holes 304.

It is noted herein that process variations may cause certain regions of the specimen to have tapered channel holes 304 (e.g., variation in the channel hole size). Although the physical thickness of the specimen is the same, the AF system 100 may shift the specimen surface in and/or out of the best focal plane of a high performance imaging system, dependent on the severity of process variation. Thus, causing a loss of surface defect detection sensitivity.

Figure 4:
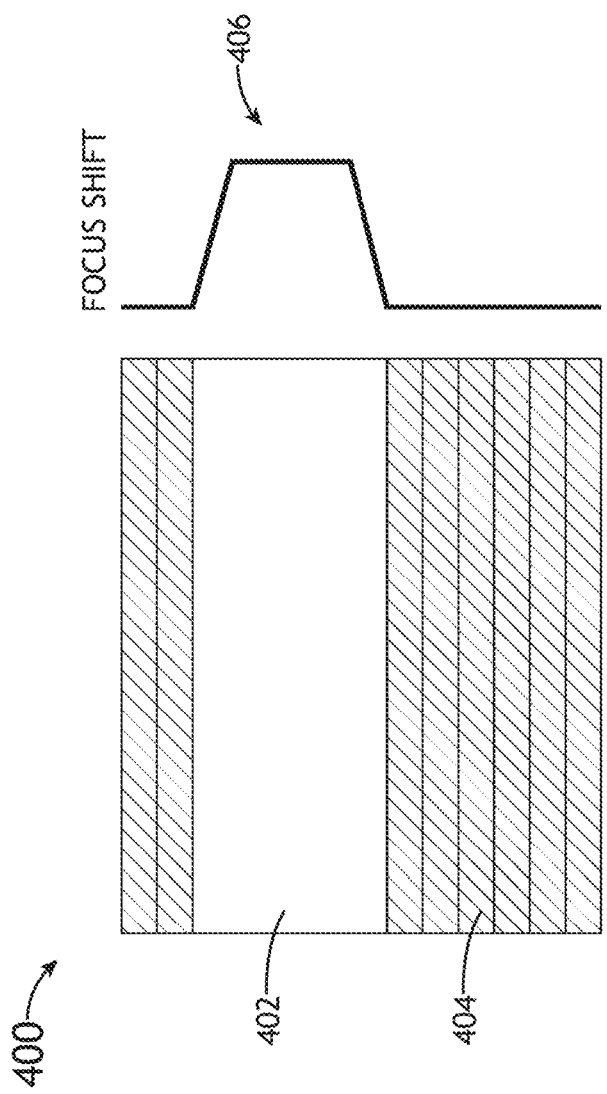
FIG. 4 illustrates a top view of sensitivity of the AF system shown in FIG. 1 to pattern geometry, in accordance with one or more embodiments of the present disclosure.

FIG. 4 illustrates a top view of sensitivity 400 of the AF system 100 to pattern geometry of a specimen, in accordance with one or more embodiments of the present disclosure.

It is noted herein that unpatterned regions on a specimen may cause the specimen focus to shift relative to patterned regions on the specimen. The amount of focus shift is dependent on the width of the unpatterned region.

As shown in FIG. 4, the AF system 100 is sensitive to specimen pattern geometry. For example, the presence of an unpatterned region 402 in a channel hole etched array 404 may cause the focus to shift (e.g., shifted region 406), even though unpatterned regions may have the same physical height as the etched array. For instance, for an unpatterned region with a width between 5-30 μm, the focus may shift between 100-400 nm, depending on a brightness and width of the pattern.

It is noted herein that the focus shift due to the unpatterned region and the shift of the specimen up and/or down due to process variations cause inconsistencies and loss of defect detection sensitivity across the whole surface of the specimen.

Figure 5:
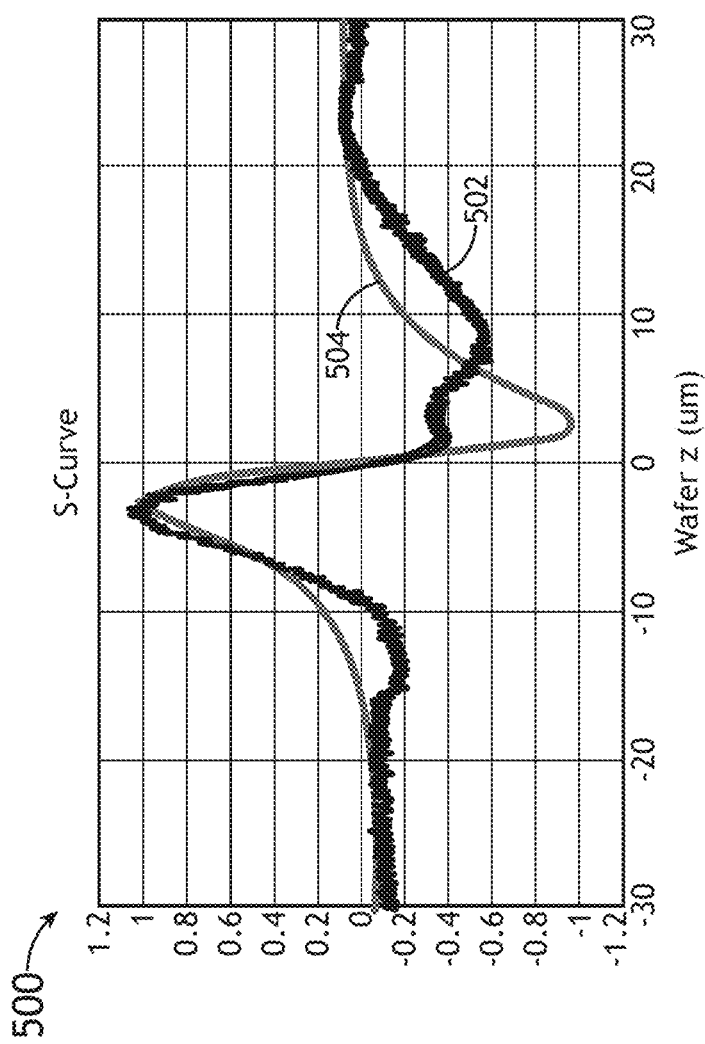
FIG. 5 is a plot including a misshaped s-curve and a symmetrical s-curve, in accordance with one or more embodiments of the present disclosure.

FIG. 5 is a plot 500 including a misshaped s-curve 502 and a symmetrical s-curve 504, in accordance with one or more embodiments of the present disclosure.

It is noted herein that one serious issue with the AF system 100 is a loss of focus on a specimen (e.g., a 3D NAND wafer with conventional AF settings). As shown in FIG. 5, this is due to the diffractive specimen pattern causing severe s-curve linear range reduction when AF light penetrates below the specimen surface.

As shown in FIG. 5, the 3D NAND wafer s-curve 502 becomes misshaped as the AF light penetrates below the 3D NAND wafer surface. In comparison, a mirrored surface with no diffractive specimen patterning exhibits a symmetrical s-curve 504 when AF light penetrates below the specimen surface.

Figure 6:
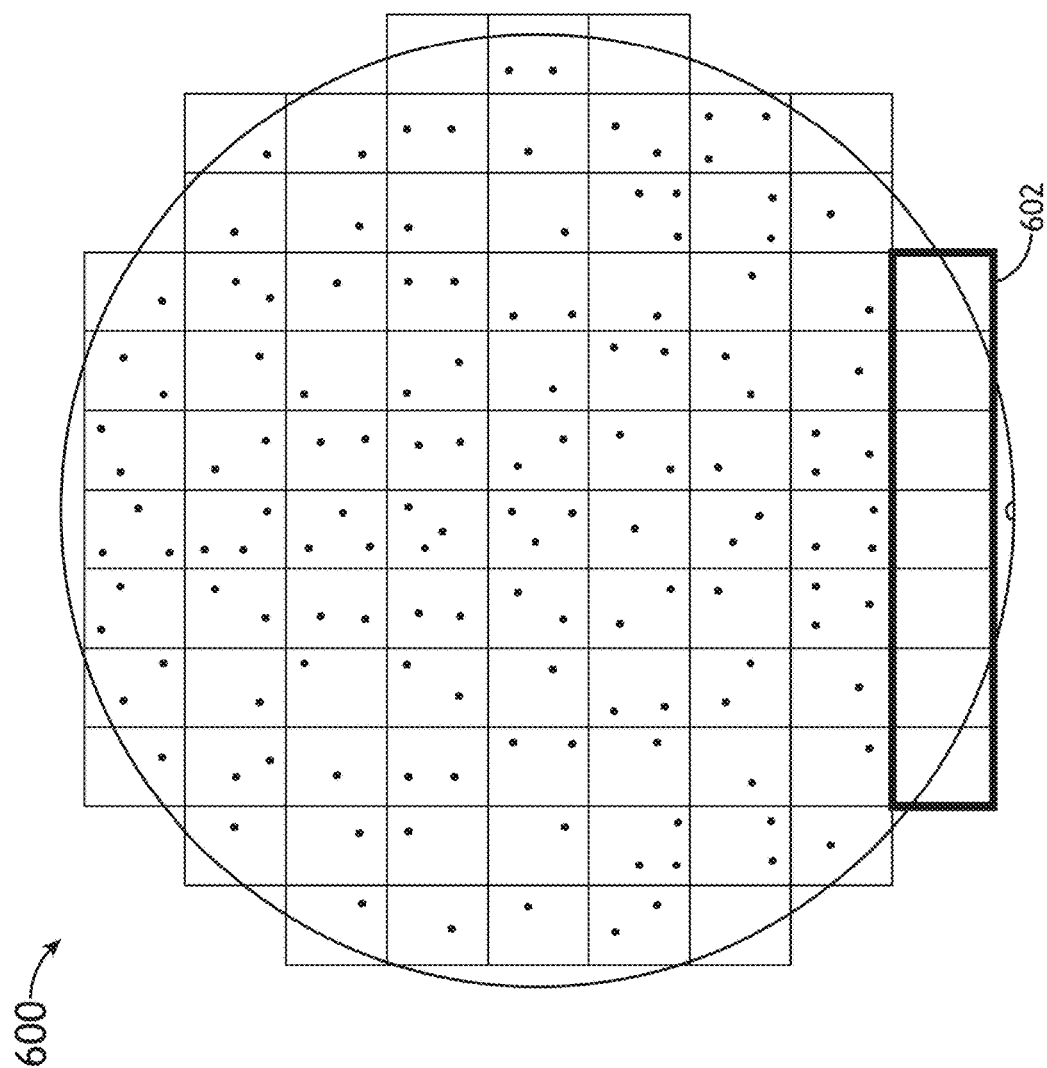
FIG. 6 illustrates a specimen defect map acquired by an imaging system coupled to the AF system shown in FIG. 1, in accordance with one or more embodiments of the present disclosure.

FIG. 6 illustrates a specimen defect map 600 acquired by an imaging system 150 coupled to the AF system 100, in accordance with one or more embodiments of the present disclosure.

In the specimen map 600 each dot corresponds to one detected defect. As shown in FIG. 6, at the bottom 602 of the specimen map 600 includes zero dots, meaning that zero defects have been detected at the bottom of the specimen. This is due to a loss of focus in the AF system 100. It is noted herein that to inspect a defect at the very bottom of a high specimen stack, which can be up to approximately 30 µm high, a focusing lens in the AF system needs to support a z-axis adjustment range of 80 mm with high resolution. This may be extremely difficult for engineering design. Further, the s-curve will be skewed at large focus offsets due to excessive spherical aberrations.

FIG. 7 illustrates a plot including a skewed and asymmetrical s-curve 700 and a symmetrical s-curve 702, in accordance with one or more embodiments of the present disclosure.

It is noted herein that when the specimen is moved up a skewed and asymmetrical s-curve is the result. As shown in FIG. 7, when the specimen is moved up 10 µm along the z-axis, the skewed and asymmetrical s-curve 700 results due to excessive spherical aberrations. In comparison, when the specimen focus offset is zero, a symmetrical s-curve 702 results.

Auto-focusing (AF) systems have been instrumental to achieving peak defect detection sensitivity for optical-based imaging systems. These optical-based AF systems have advantages over non-optical systems. For example, optical-based AF systems have fast signal responses and high sensitivity. However, the optical-based AF systems, like AF system 100, have a number of disadvantages. For example, the specimen may be thick and transparent (or semi-transparent), such that light can propagate below the top surface. Making it very difficult to differentiate returned AF light from the top and bottom surface, especially when the specimen has two or multiple surfaces which are only a select distance apart (e.g., approximately 10 nm-µm apart).

Further, it can be very challenging for an optical-based AF system to maintain focus of an imaging system's best focal plane on a top surface of a specimen within one depth of focus (DOF). The specimen itself can have different refractive indexes at different locations (e.g., x-axis and y-axis), which in return modules AF signal intensity. This becomes even more challenging when the DOF is very short. For example, the DOF may be approximately 100 nm for an imaging system operating at 0.9 numerical aperture (NA) having a wavelength of 200 nm.

For a fully automated imaging system, the best focal plane must be maintained at a user configurable focus offset, typically on a specimen surface, to achieve the best image quality and thus the best detection sensitivity. An automated focusing system can be integrated with high performance imaging systems to achieve such purpose.

Based on the shortcomings of the AF system 100, embodiments of the present disclosure are directed toward an automated focusing (AF) system for tracking the specimen surface with a configurable focus offset. In particular, embodiments of the present disclosure are directed to an AF system integrated with a high performance imaging system to achieve the best image quality and best detection sensitivity.

Figure 8A:
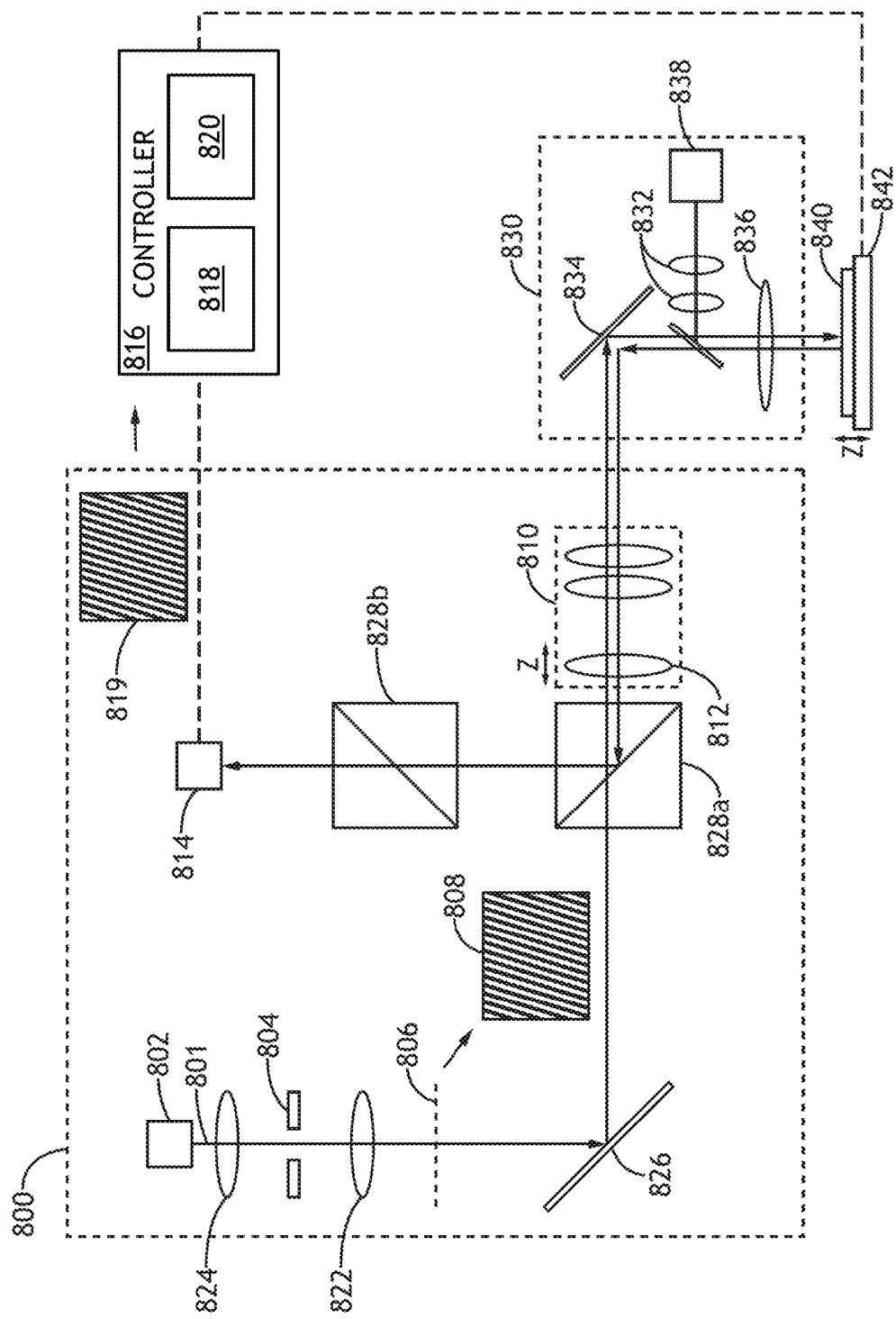
FIG. 8A illustrates a simplified schematic view of AF system, in accordance with one or more embodiments of the present disclosure.

FIG. 8A illustrates a simplified schematic view of an AF system 800 coupled to an imaging system 830, in accordance with one or more embodiments of the present disclosure. In one embodiment, the AF system 800 is optically coupled to the imaging system 830 via a relay system 810.

In one embodiment, the AF system 800 includes an illumination source 802 configured to generate illumination 801. The illumination source 802 may include any illumination source known in the art for generating illumination 801 including, but not limited to, a broadband radiation source, a narrowband radiation source, or the like.

In another embodiment, the AF system 800 includes an aperture 804. For example, the AF system 800 may include a pupil aperture 804. The aperture may have any shape or numerical aperture value known in the art. For example, the pupil aperture 804 may have a numerical aperture of 0.9 NA.

Figure 14:
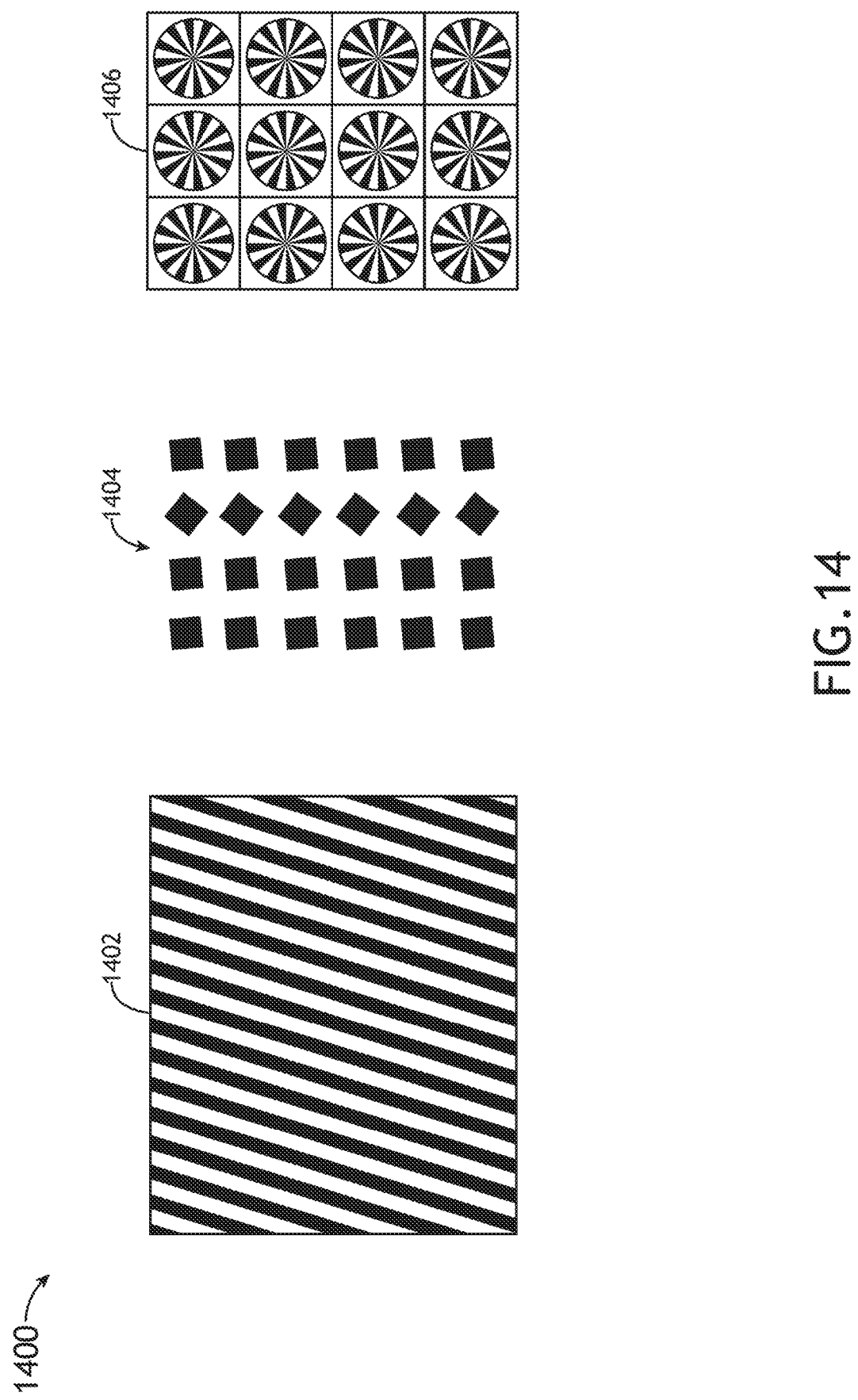
FIG. 14 illustrates exemplary project mask patterns, in accordance with one or more embodiments of the present disclosure.

In another embodiment, the AF system 800 includes a projection mask 806 configured to project a geometric pattern 808 onto specimen 840. For example, the projection mask 806 may include an external project mask containing one or more selected patterns (as shown in FIG. 14 and discussed further herein), which may be projected onto a plane of a specimen 840 via the relay system 810 and the imaging system 830. It is noted herein that the geometric pattern 808 may generated via any method known in the art. For example, the geometric pattern 808 may be a simple binary mask. By way of another example, the geometric pattern 808 may be generated by a spatial light modulator. By way of a further example, the geometric pattern 808 may be generated by optical diffraction (or interference means).

The relay system 810 may include any set of optical elements known in the art for relaying the projection mask image 819 from a first optical system and a second optical system. For example, the relay system 810 may include, but is not limited to, a focusing lens 812. For instance, the focusing lens 812 may include a z-adjustable focusing lens 812.

In another embodiment, the AF system 800 includes a detector assembly 814. For example, as shown in FIG. 8A, the detector assembly 814 may include, but is not limited to, one or more cameras 814. The AF system 800 may include any type of camera. For example, the AF system 800 may include, but is not limited to, a two-dimensional (2D) camera. By way of another example, the AF system 800 may include, but is not limited to, a titled 2D camera. By way of a further example, the AF system 800 may include, but is note limited to a tilted projection mask.

In another embodiment, the detector assembly 814 is communicatively coupled to a controller 816. The controller 816 may include one or more processors 818. The one or more processors 818 are configured to execute a set of program instructions stored in memory 820. The set of program instructions are configured to cause the one or more processors 818 to execute one or more steps of the present disclosure. In one embodiment, the one or more processors 818 are configured to receive one or more projection mask images 819 from the detector assembly 814 of the AF system 800. In another embodiment, the one or more processors 818 are configured to determine projection mask image quality (PMIQ). For example, the one or more processors 818 may apply one or more focus metrics, which can be optimized for different purposes or applications, to determine image quality of the projection mask image 819.

In another embodiment, the one or more processors 818 may adjust the stage assembly 842 in response to the projection mask image quality (PMIQ). For example, in response to the monitored projection mask image quality, the one or more processors 818 may dynamically adjust the vertical position (i.e., z-position) of the stage assembly 842 such that the specimen z-position is adjusted to (or maintained at) at an optimal (or at least a sufficient) focal position.

The AF system 800 may include any optical elements 822 known in the art for facilitating the operation of the AF and imaging systems and the coupling between the AF and imaging systems. For example, the one or more optical elements 822 may include, but are not limited to, one or more lenses 824, one or more mirrors 826, or one or more beam splitters 828a, 828b. In addition, although not shown, the AF system 800 may include any additional optical elements known in the art including, but not limited to, one or more polarizers, one or more beam splitters, one or more wave plates, and the like.

The imaging system 830 may include one or more optical elements 832 including, but not limited to, one or more mirrors 834, one or more objective lenses 836, and the like. In another embodiment, the imaging system 830 includes one or more detectors 838 configured to acquire illumination (e.g., reflected, diffracted, or scattered) from specimen 840. The one or more detectors 838 may be communicatively coupled to the controller 816. In this regard, the one or more processors 818 of the controller 816 may receive signal and/or image data from the one or more detectors 838 of the imaging system 830. The imaging system 830 may include any imaging system known in the art. For example, the imaging system may include an inspection system, an image-based metrology system, a machine vision system, or a biological/biomedical imaging system.

Specimen 840 may include any specimen known in the art including, but not limited to, a wafer, a reticle, a photomask, and the like. In one embodiment, specimen 840 is disposed on a stage assembly 842 to facilitate movement of specimen 840. In another embodiment, the stage assembly 842 is an actuatable stage. For example, the stage assembly 842 may include, but is not limited to, one or more translational stages suitable for selectively translating the specimen 840 along one or more linear directions (e.g., x-direction, y-direction and/or z-direction). By way of another example, the stage assembly 842 may include, but is not limited to, one or more rotational stages suitable for selectively rotating the specimen 840 along a rotational direction. By way of another example, the stage assembly 842 may include, but is not limited to, a rotational stage and a translational stage suitable for selectively translating the specimen 840 along a linear direction and/or rotating the specimen 840 along a rotational direction.

FIG. 8B illustrates AF light patterns 850, 852 of the AF system 800 shown in FIG. 8A, in accordance with one or more embodiments of the present disclosure.

In one embodiment, AF light being reflected from a surface of a specimen forms the AF light pattern 850. In another embodiment, AF light being penetrated into a specimen forms the light AF light pattern 852. It is noted herein that the AF light pattern 850 illustrates that the AF system 800 has the best PMIQ when a tight focused spot is reflected from the specimen surface. Further, it is noted herein that the focus spread of the AF light pattern 852 spreads along the XYZ-axis. The AF light pattern 852 illustrates that a tight focus spot can be spread in the XYZ direction, which implies a degraded point spread function due to the light being penetrated into the specimen.

It is noted herein that if the projection mask (PM) image, from the projection mask (PM), projected to the specimen has a high numerical aperture and diffraction is limited by the imaging quality, the specimen reflected PM image has the best image quality only when it is reflected from a top surface. As illustrated in FIG. 8B, for a highly focused spot which can be considered a point spread function (PSF) of an optical system, from the PM to the specimen when the light penetrates the specimen and is reflected from one or more points on a bottom surface, a specimen thickness and material refraction will cause a spot size to spread in both a lateral direction and along an optical axis. This leads to aberrations of nearly perfect PSF. Hence, PM imaging quality degrades.

Figure 8C:
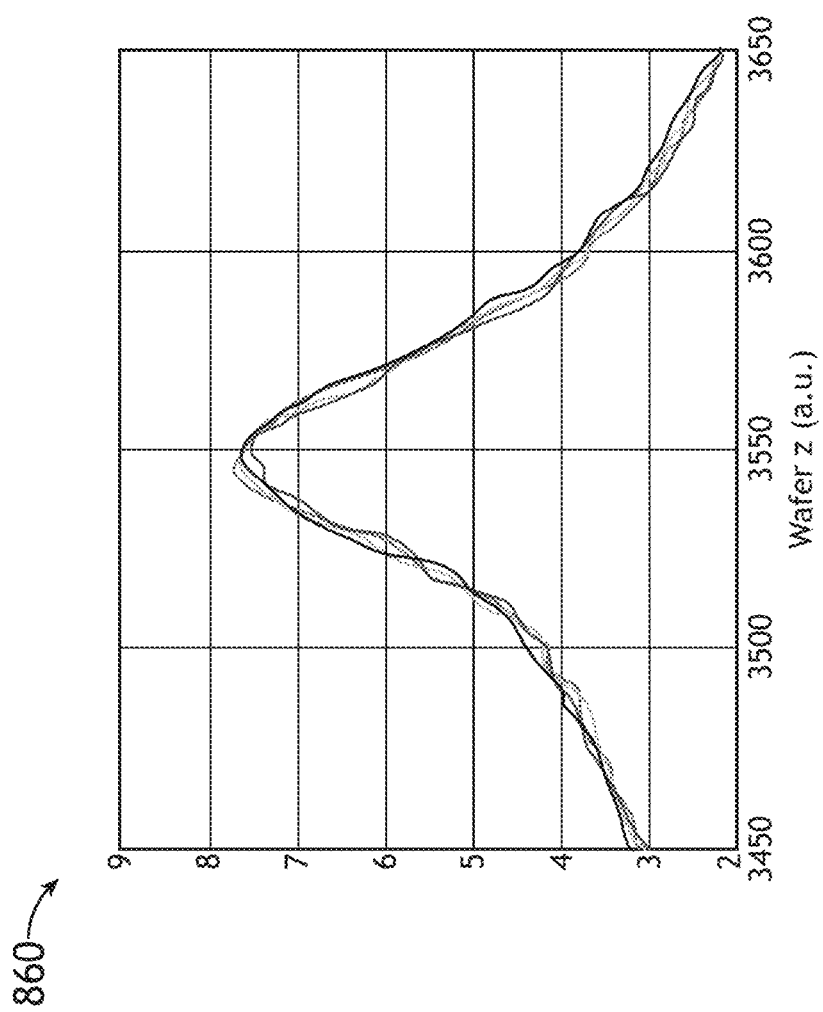
FIG. 8C illustrates a through focus curve (TFC) of the AF system, in accordance with one or more embodiments of the present disclosure.

FIG. 8C illustrates a through focus curve (TFC) 860 of the AF system 800, in accordance with one or more embodiments of the present disclosure.

In one embodiment, the one or more processors 818 of the AF system 800 are configured to determine image quality of the one or more images 819 of the projection mask 806 based on applying one or more focus metrics to the one or more images 819 of the projection mask 806. For example, the one or more processors 818 may be configured to apply a through focus curve (e.g., TFC 860) to the one or more images 819 of the projection mask 806. It is noted herein that as the specimen 840 moves up and down, PMIQ can be quantitatively measured with the one or more focus metrics (e.g., TFC 860) which can be adjusted for different application purposes. The TFC 860 shown in FIG. 8C includes five repeats measured on a specimen 840 (e.g., a mirror specimen). The peak-to-peak variation of the five repeats is approximately 30 nm.

Figure 8D:
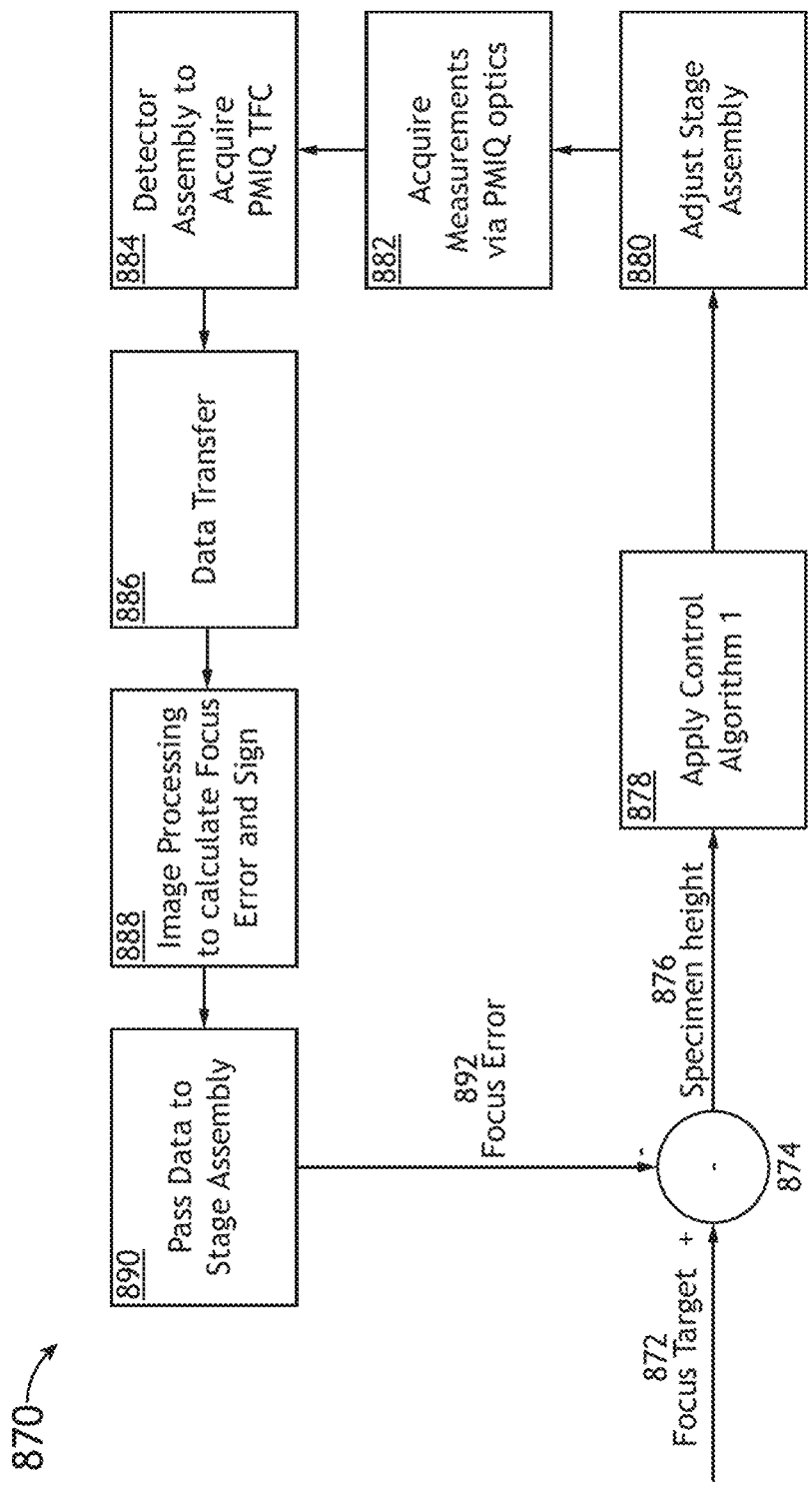
FIG. 8D illustrates a process flow diagram depicting a focus control loop of the AF system, in accordance with one or more embodiments of the present disclosure.

FIG. 8D illustrates a process flow diagram depicting a focus control loop 870 of the AF system 800, in accordance with one or more embodiments of the present disclosure. It is noted that the description of the various embodiments, components, and operations described previously herein with respect to PMIQ should be interpreted to extend to the dual control loop 870 unless otherwise noted. It is further noted that the various steps 872-892 should not be interpreted as being limited to the particular order depicted in FIG. 8D or described herein. Rather, it is noted that the control loop 870 may start at any number of locations in the control loop 870 and bypass and/or repeat any number of steps.

In step 872, the focus control loop 870 generates a focus target.

In step 874, the focus control loop 870 adjusts the focus target.

In step 876, the focus control loop 870 generates a height of a specimen.

In step 878, the focus control loop 870 applies a control algorithm (e.g., control algorithm 1).

In step 880, the focus control loop 870 adjusts a stage assembly based on the output of the control algorithm (e.g., control algorithm 1). For example, the system 800 may be configured to adjust the stage assembly 842 in a z-direction.

In step 882, the focus control loop 870 acquires one or more measurements using one or more PMIQ optics.

In step 884, the focus control loop 870 acquires a PMIQ TFC via a detector assembly. For example, the detector assembly 814 of the AF system 800 may be configured to acquire the PMIQ TFC.

In step 886, the focus control loop 870 transfers data based on the PMIQ TFC. For example, the second loop 962 may be configured to transfer selected data via a data path to a selected destination for processing.

In step 888, the focus control loop 870 processes one or more PM images to calculate focus error and sign.

In step 890, the focus control loop 870 passes data to the stage assembly. For example, the system 800 may be configured to pass data to the stage assembly 842.

In step 892, the focus control loop 870 generates the one or more focus errors. For example, the focus control loop 870 may calculate a focus error expresses as a distance (e.g., number of nanometers).

It is noted herein that a control system may be designed in such a way that the specimen z-position is dynamically adjusted to maintain the specimen z-position at the peak position of TFC.

Figure 8E:
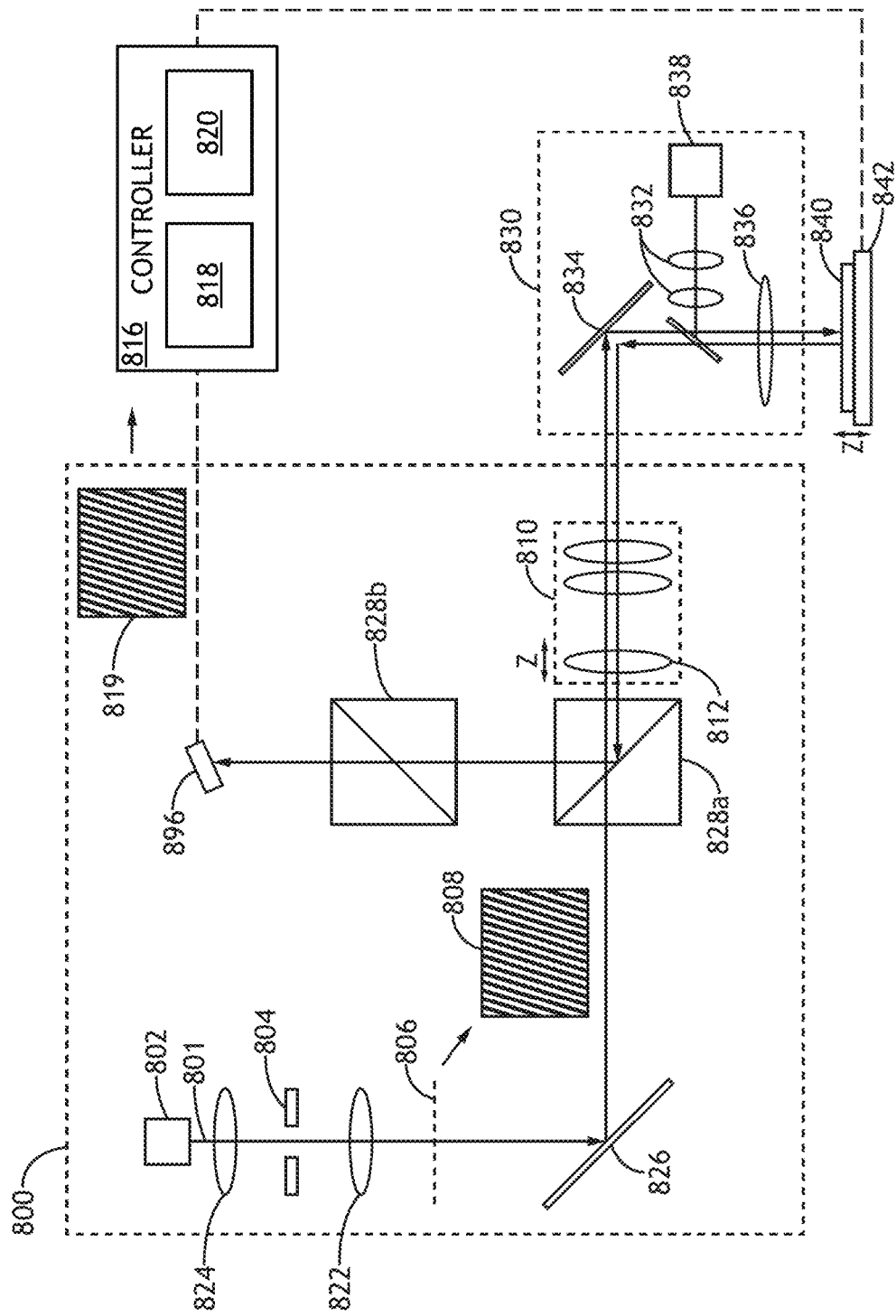
FIG. 8E illustrates an additional/alternative embodiment of the AF system, in accordance with one or more embodiments of the present disclosure.

FIG. 8E illustrate the AF system 800, in accordance with one or more additional/alternative embodiments of the present disclosure. In this embodiment, the detector assembly 814 of the AF system 800 includes one or more tilted 2D cameras 896 configured to be tilted in-and-out of a focus plane. For example, the one or more tilted 2D cameras 896 may be tilted in-and-out of the focus plane in at least one of a rX (rotation about the x-axis) or a rY direction (rotation about the y-axis). It is noted herein that the optical axis may be defined as the z-axis. In this regard, when the specimen 840 is moving in the XY plane for automated imaging, a full TFC may be obtained with the one or more tilted 2D cameras 896. Further, each point of the TFC may be mapped from the one or more images of the projection mask at each XY location on the one or more tilted 2D cameras. Further, it is noted herein that the one or more titled 2D cameras 896 may be configured to obtain the TFC without continuously moving the specimen 840 in the z-direction.

Figure 8F:
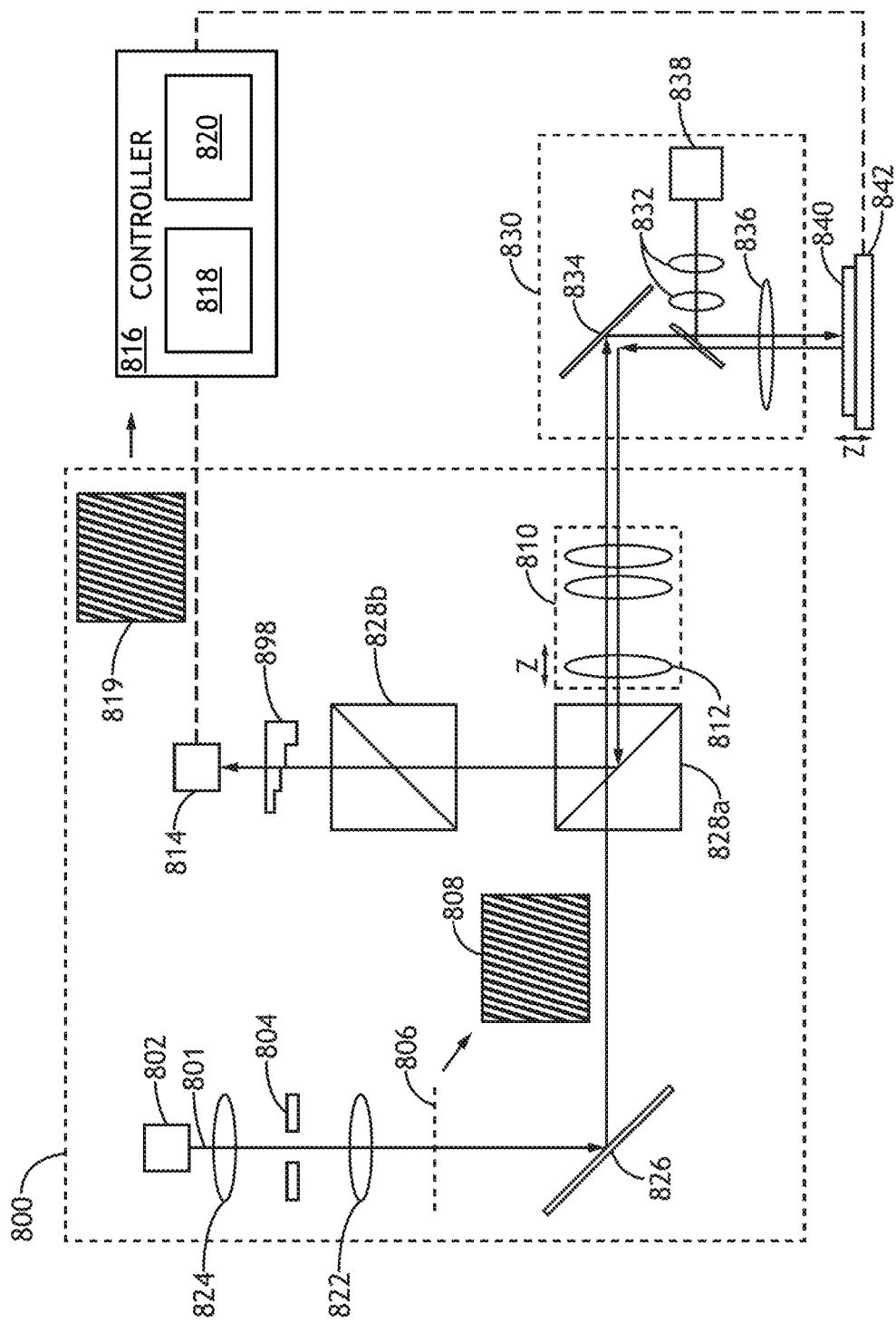
FIG. 8F illustrates an additional/alternative embodiment of the AF system, in accordance with one or more embodiments of the present disclosure.

FIG. 8F illustrate the AF system 800, in accordance with one or more additional/alternative embodiments of the present disclosure. In this embodiment, the detector assembly 814 of the AF system 800 includes one or more 2D cameras 814 and one or more transparent plates 898. For example, the one or more transparent plates 898 may be disposed in front of the one or more 2D cameras 814 and have a thickness that varies across the one or more transparent plates 898. It is noted herein that the one or more transparent plates 898 may be formed of any transparent material known in the including, but not limited to, glass, quartz, or the like.

Figure 9A:
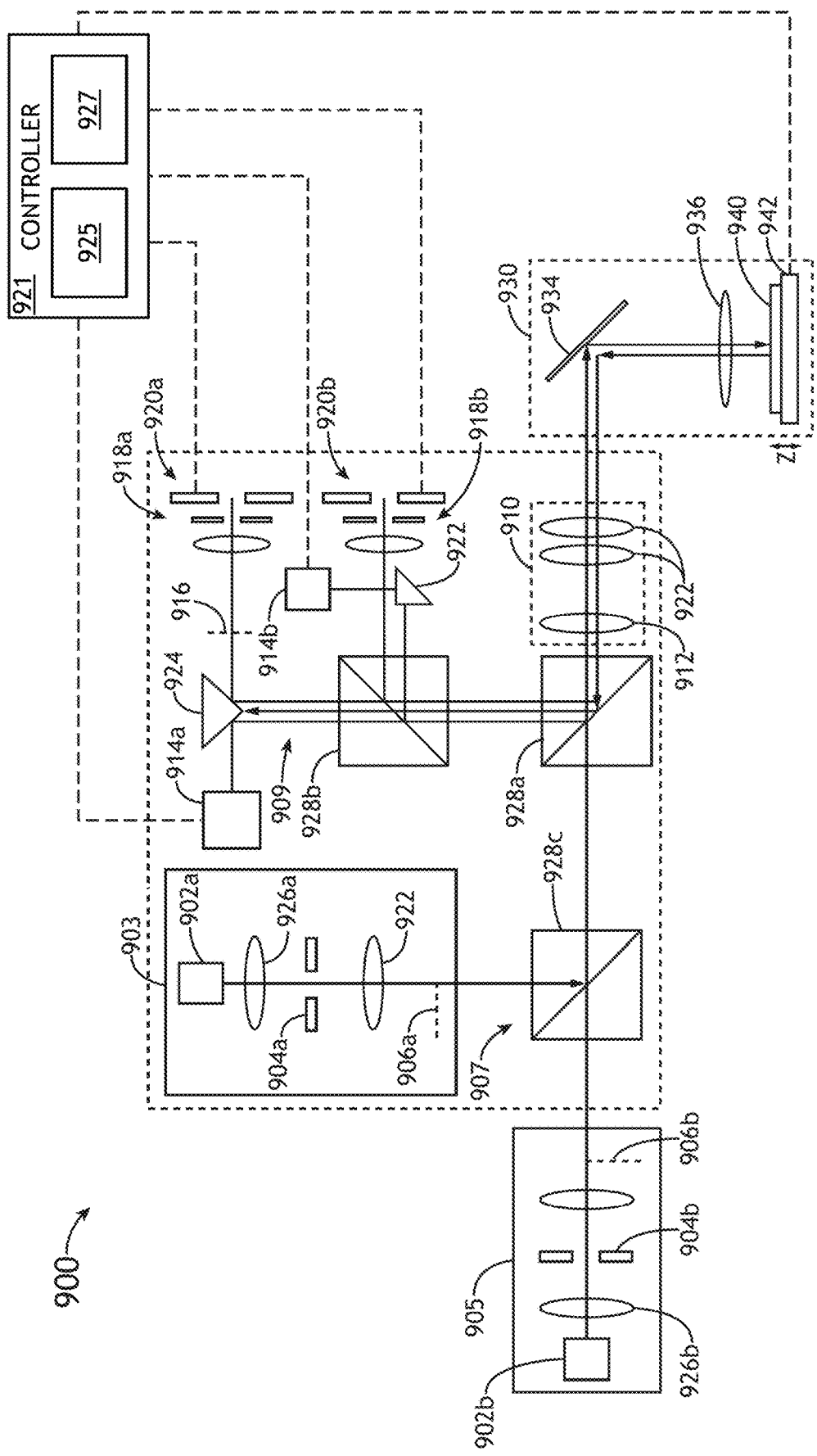
FIG. 9A illustrates a simplified schematic view of an AF system, in accordance with one or more embodiments of the present disclosure.

FIG. 9A illustrates a simplified schematic view of an AF system 900 coupled to an imaging system 930, in accordance with one or more embodiments of the present disclosure. In particular, FIG. 9A illustrates an AF system 900 configured for dual mode simultaneous operation. The AF system 900 may include a PMIQ projection system 903 (or PMIQ module) and an NSC projection system 905 (or NSC module). In another embodiment, the AF system 900 is coupled to the imaging system 930 via a relay system 910. In this regard, the relay system 910 is configured to optically couple illumination from the PMIQ autofocusing system and the NSC auto-focusing system to imaging system 930.

In this embodiment, the PMIQ projection system 903 and the NSC projection system 905 may each include their own illumination source, aperture, projection mask, illumination level control, and NA settings. For example, the PMIQ projection system 903 may include, but is not limited to, a first illumination source 902a, a first aperture 904a, and a first projection mask 906a. The NSC projection system 905 may include, but is not limited to, a second illumination source 902b, a second aperture 904b, and a second projection mask 906b.

In one embodiment, the illumination source 902a of the PMIQ auto-focusing projection system 903 is configured to operate in a continuous ON-state mode. In another embodiment, the illumination source 902b of the NSC autofocusing projection system 905 includes a first illumination channel (Channel A) and a second illumination channel (Channel B). The output of the illumination source 902b of the NSC auto-focusing projection system 905 may be time-multiplexed to mitigate crosstalk between the first illumination channel (Channel A) and the second illumination channel (Channel B).

Figure 9B:
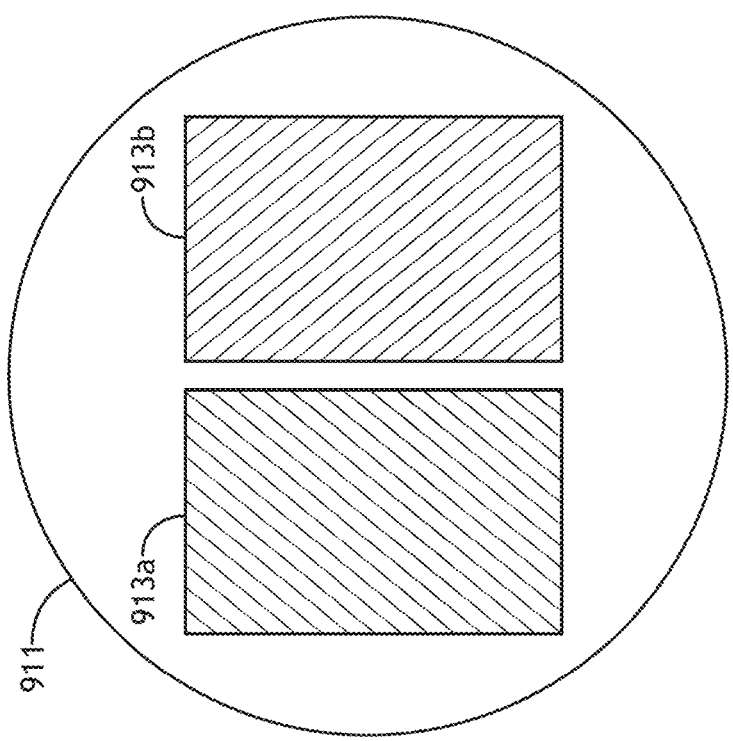
FIG. 9B illustrates a field of view of the AF system, in accordance with one or more embodiments of the present disclosure.

In another embodiment, the first projection mask 906a and the second projection mask 906b are positioned such that the first projection mask 906a is projected in a first half of the field of view and the second projection mask 906b is projected in a second half of the field of view. In this regard, as shown in FIG. 9B, the system 900 may be configured such that the PMIQ projection system 903 uses a first half (e.g., left) of the field of view and the NSC projection system 905 uses a second half (e.g., right) half of the field of view. Such an arrangement assists in mitigating optical cross-talk between the PMIQ autofocusing projection system 903 and the NSC autofocusing projection system 905. For example, as shown in FIG. 9B, the projection from the PMIQ projection system 903 may occupy the left-side 913a of the field of view (FOV), while the projection from the NSC projection system 905 may occupy the right-side 913b of the FOV.

In another embodiment, the first projection mask 906a and the second projection mask 906b may have one or more different characteristics. For example, the first projection mask 906a and the second projection mask 906b may have a different grid mask pattern, a grid mask pitch, or a grid mask orientation. The projection masks 906a, 906b may include one or more external projection masks containing one or more selected patterns (as shown in FIG. 14 and discussed further herein), which may be projected onto a plane of a specimen 940 via the relay system 910 and the imaging system 930.

It is noted herein that the PMIQ projection system 905 may operate with 0.9 NA settings for both an illumination and collection pathway 907, 909, respectively. Further, the NSC projection system 905 may operate with a reduced NA in both the illumination and collection pathway 907, 909 respectively. For example, the NSC projection system 905 may operate with a NA less than 0.9 NA. For instance, the NSC projection system 905 may operate with a NA between 0.4-0.6 NA. Further, the NSC projection system may operate with a NA of 0.5 NA. However, it is noted herein that the settings of NA may be optimized based on the application.

In another embodiment, the AF system 900 includes one or more PMIQ detector assemblies. For example, as shown in FIG. 9A, the PMIQ projection system 903 may include a first PMIQ detector assembly 914a and a second PMIQ detector assembly 914b. For instance, the first PMIQ detector assembly 914a and the second PMIQ detector assembly 914b may include, but are not limited to, a first 2D camera 914a and a second 2D camera 914b, respectively. It is noted herein the one or more 2D cameras 914 may have predetermined z-offsets to obtain a few discrete points on a TFC curve.

In another embodiment, the AF system 900 includes one or more NSC detector assemblies. For example, as shown in FIG. 9A, the NSC projection system 903 may include a first detector assembly 920a and a second detector assembly 920b. For instance, the NSC projection system 903 may include a first sensor 920a and a second sensor 920b The first sensor 920a may include one or more focus sensors configured to receive one or more focus signals (e.g., $F_a$, $F_b$) from the one or more illumination channels (e.g., Channel A and Channel B) of the NSC projection system 905. The second sensor 920b may include normal sensors 920b configured to receive one or more normal signals (e.g., $N_a$, $N_b$) from the one or more illumination channels (e.g., Channel A and Channel B) of the NSC projection system 905.

In another embodiment, the AF system 900 includes one or more collection pupil aperture stops 918. For example, the AF system 900 may include a first collection pupil aperture stop 918a and a second collection pupil aperture stop 918b associated with the first sensor 920a and the second sensor 920b, respectively, of the NSC projection system 905. For instance, the first collection pupil aperture stop 918a may have a first numerical aperture (e.g., 0.5 NA). In another instance, the second collection pupil aperture stop 918b may have a second numerical aperture (e.g., 0.5 NA). It is noted herein that the one or more collection pupil aperture stops 918a, 918b may have any numerical aperture value.

In another embodiment, the AF system 900 includes a return mask 916. For example, the AF system 900 may include a return mask 916 with the same pattern as the projection mask. By way of another example, the AF system 900 may include a return mask with a different pattern than the projection mask. It is noted herein that the return mask may be used in the focus channel to generate focus signals for the NSC projection system 905. The return mask 916 acts like optical valve against reflected projection mask image. When specimen is in focus, focus sensor channel A & B receives the same amount of light. When specimen is out of focus, one channel receives more light than the other channel and vice versa. Defocus directionality can be determined by which channel received more light.

In another embodiment, the one or more PMIQ detector assemblies 914 and the one or more NSC sensors 920 are communicatively coupled to the controller 921. The controller 921 may include one or more processors 925. The one or more processors 925 are configured to execute a set of program instructions stored in memory 927. The set of program instructions are configured to cause the one or more processors 925 to execute one or more steps of the present disclosure. In one embodiment, the one or more processors 925 are configured to receive one or more signals from the first PMIQ detector assembly 914a, the second PMIQ detector assembly 914b, the first NSC detector assembly 920a, and the second NSC detector assembly 920b. In another embodiment, the one or more processors 925 are configured to execute a dual control loop based on the one or more signals from the first PMIQ detector assembly, the second PMIQ detector assembly, the first NSC detector assembly, and the second NSC detector assembly to adjust the stage assembly 942 (e.g., z-position) to maintain (or establish) focus of the imaging system 930.

The relay system 910 may include any set of optical elements known in the art for relaying illumination from a first optical system and a second optical system. For example, the relay system 910 may include, but is not limited to, a focusing lens 912. For instance, the focusing lens 912 may include a z-adjustable focusing lens 912.

The imaging system 930 may include any imaging system known in the art and the description of the imaging system 830 provided previously herein should be interpreted to extend to imaging system 930. The imaging system 930 may include one or more optical elements 932 including, but not limited to, one or more mirrors 934, one or more objective lenses 936, and the like. In another embodiment, the imaging system 930 includes one or more detectors configured to acquire illumination (e.g., reflected, diffracted, or scattered) from specimen 940. The one or more detectors may be communicatively coupled to the controller 921. In this regard, the one or more processors of the controller may receive signal and/or image data from the one or more detectors of the imaging system 930. The imaging system 930 may include any imaging system known in the art. For example, the imaging system may include an inspection system, an image-based metrology system, a machine vision system, or a biological/biomedical imaging system.

Specimen 940 and stage assembly 942 may include any specimen and stage assembly known in the art and the description of the specimen 840 and the stage assembly 842 provided previously herein should be interpreted to extend to the specimen 940 and stage assembly 942.

The AF system 900 may include any optical elements 922 known in the art for facilitating the operation of the AF and imaging systems and the coupling between the AF and imaging systems. For example, the one or more optical elements 922 may include, but are not limited to, one or more prism mirrors 924 (e.g., top surface reflection or internal reflection), one or more lenses 926a, 926b and one or more beam splitters 928a, 928b, and/or 928c. In addition, although not shown, the AF system 900 may include any additional optical elements known in the art including, but not limited to, one or more polarizers, one or more beam splitters, one or more mirrors, one or more wave plates, and the like.

Figure 9C:
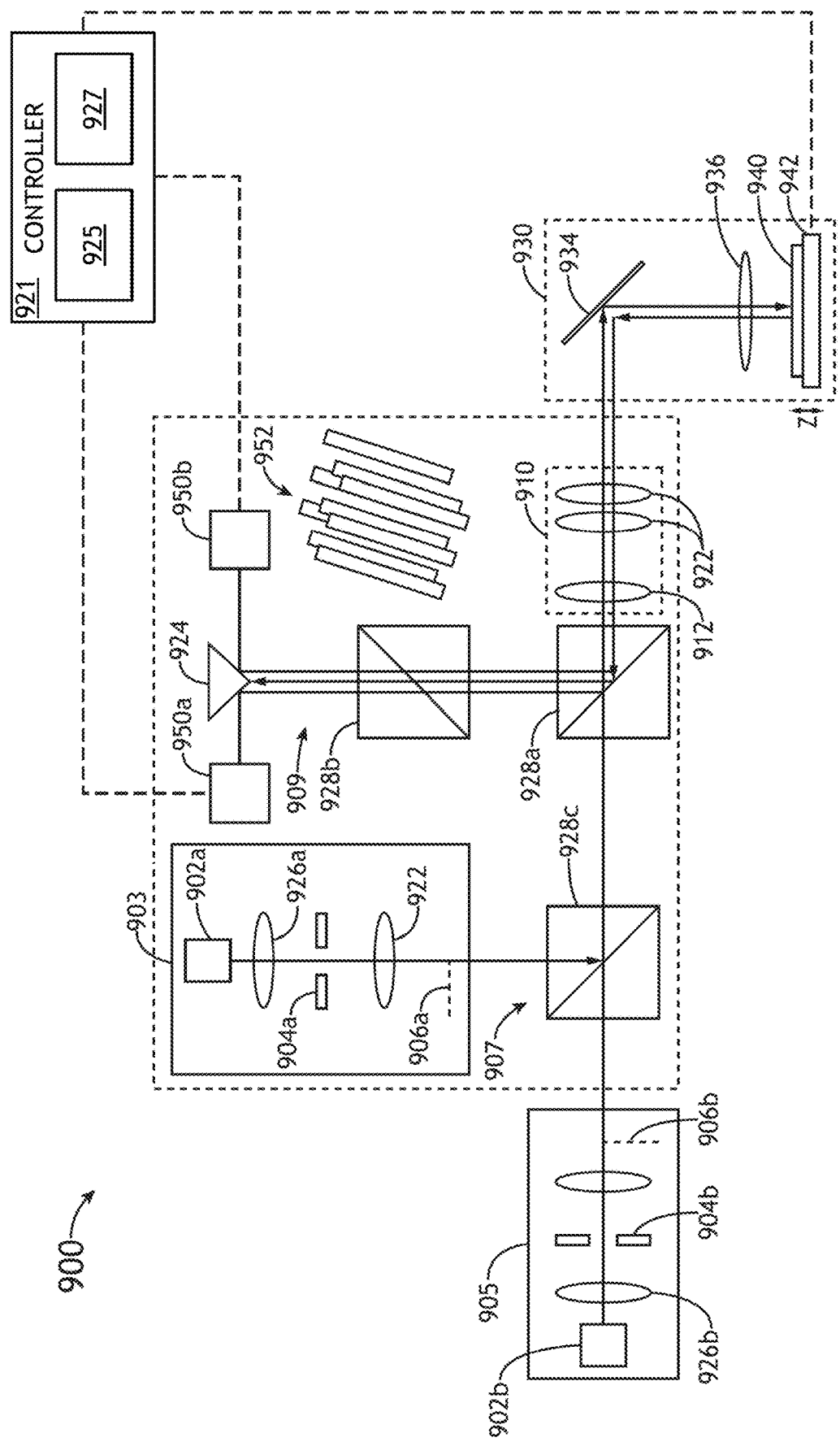
FIG. 9C illustrates an additional/alternative embodiment of the AF system, in accordance with one or more embodiments of the present disclosure.

FIG. 9C illustrates an additional/alternative embodiment of the AF system 900, in accordance with one or more embodiments of the present disclosure. It is noted that the description of the embodiments of system 800 and 900 should be extended to the embodiment depicted in FIG. 9B unless otherwise noted herein.

In this embodiment, the AF system 900 includes a PMIQ camera 950a and an NSC camera 950b. For example, the system 900 may include a 2D camera 950a configured as a PMIQ camera and a 2D camera 950b configured as an NSC AF camera. In another embodiment, the AF system 900 may apply a digital binary return mask 952 during image processing to compute a transmitted total integrated energy.

In this embodiment, the PMIQ camera 950a and the NSC camera 950b may be communicatively coupled to the controller 921 of the AF system 900. In this regard, the NSC camera 950b replaces the normal channel and focus channel of FIG. 9A. Further, the one or more processors 925 of the controller 921 may be configured to generate the NSC using the data from the NSC camera 950b.

The digital binary return mask 952 may be configured to compute a transmitted total integrated energy over a full field of view (FOV) of the NSC AF camera 950b as $F_a$, $F_b$, respectively. In this regard, the NSC signal may be computationally generated with a single camera (e.g., the NSC camera 950b). It is noted herein that this embodiment may decrease the cost of development of high precision optics and reduce focus detection artifact from optical imperfections.

It is noted herein that the second illumination source 902b of the NSC projection system 905 including channel A and B is configured to be turned on in time sequence. Further, for purposes of the present disclosure, the term "$N_a$ signal" or "$N_b$ signal" refers to the total integrated energy within the AF camera's 950a FOV when channel A and/or B light is on.

In another embodiment, the NSC may be computed using total integrated energy within the FOV of the NSC camera 950b. For example, when the specimen moves in a z-direction, one can detect lateral shift of a single edge of a projection mask image when one channel of illumination is turned on. For instance, if channel A (or B) illuminates projection mask from right (or left) side of pupil, then one can analyze lateral motion of right (or left) edge of projection mask. The motion direction of two channels should be opposite. After subtracting the two channels' motion, detection sensitivity can be doubled. The NSC signal obtained with edge motion detection can reduce or even avoid energy coming from sub-surface reflection, biasing total energy in $F_a$, $F_b$, $N_a$, $N_b$, which in turn causes defocus from specimen surface. Conceptually, image edge can be easily detected by taking derivative of raw image.

Figure 9D:
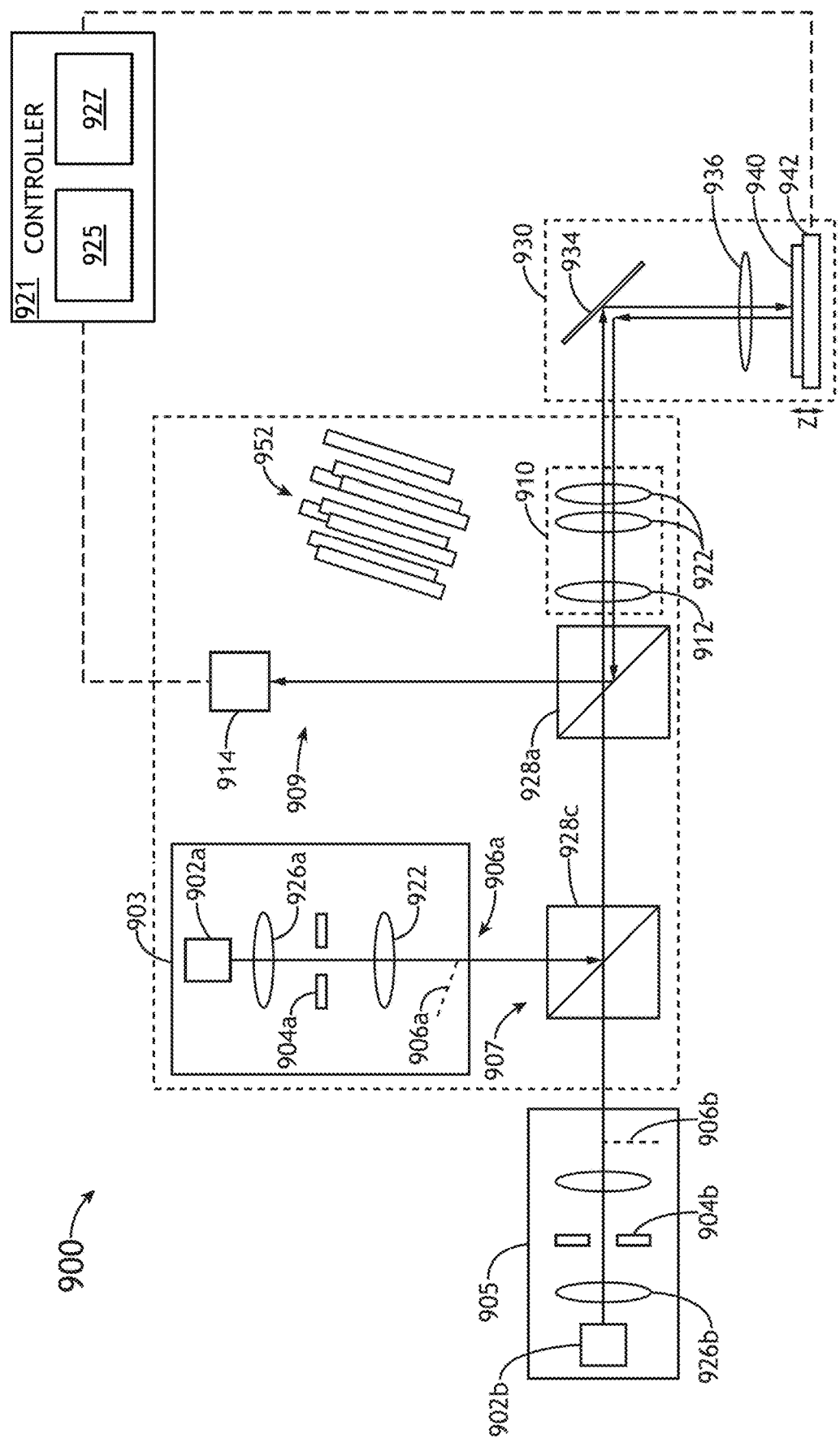
FIG. 9D illustrates a simplified schematic view of the AF system, in accordance with one or more embodiments of the present disclosure.

FIG. 9D illustrates an additional/alternative embodiment of the AF system 900, in accordance with one or more embodiments of the present disclosure.

In one embodiment, the one or more projection masks 906 of the AF system 900 include one or more tilted projection masks 954. For example, the one or more tilted projection mask 954 may be tilted to obtain a complete TFC curve without moving one or more components of the AF system 900. In in this additional/alternative embodiment, the geometric pattern of the tilted projection mask 954 may be designed different from the geometric pattern of the second projection mask 906*b* (as shown in FIG. 9B).

In another embodiment, the detector assembly 914 of the AF system 900 includes a camera 914. For example, the camera 914 may be configured to obtain PMIQ in a left-side 913*a* of a FOV 911 and NSC from a right-side 913*b* of a FOV 911, as shown in FIG. 9B. In this embodiment, the camera 914 may be communicatively coupled to the controller 921. The one or more processors 925 of the controller 921 may be configured to measure PMIQ and generate an NSC signal.

In this embodiment, the left-side PMIQ image and right-side NSC images can be read out simultaneously. For example, an imaging processing algorithm can split the two halves of FOV. For instance, a separate image processing algorithm may be used to process the PMIQ image and the NSC images to acquire the PMIQ and NSC corresponding focus signals. The two focus signals may be combined through a dual control loop as described further herein with respect to FIG. 9E.

It is noted herein that the second illumination source 902*b* of the NSC projection system 905 is configured for time multiplexing for A/B channel differentiation.

Figure 9E:
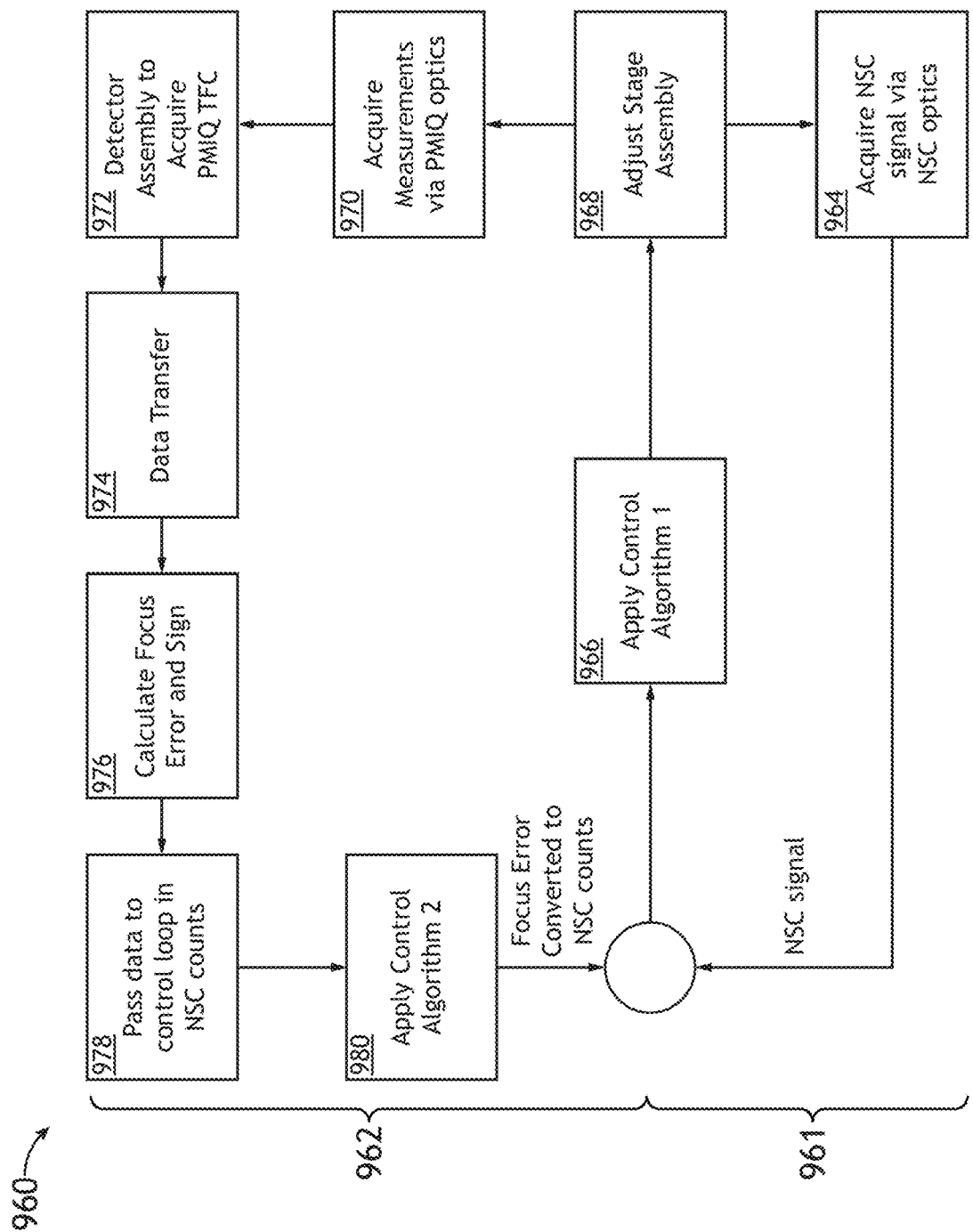
FIG. 9E illustrates a process flow diagram depicting a dual control loop of the AF system, in accordance with one or more embodiments of the present disclosure.

FIG. 9E illustrates a process flow diagram depicting a dual control loop 960, in accordance with one or more embodiments of the present disclosure.

The dual control loop 960 may include a first control loop 961 and a second control loop 962 to maintain or establish focus of an imaging system. In this embodiment, the first control loop 961 implements an NSC autofocus routine and the second control loop 962 implements a PMIQ autofocus routine, consistent with the NSC and PMIQ embodiments described previously herein, respectively. As such, the various embodiments, components, and operations described with respect to NSC and/or PMIQ embodiments should be interpreted to extend to the dual control loop 960 unless otherwise noted.

The second loop 962 may be configured to correct one or more process variations induced by defocus from the first loop 961. For instance, the second loop 962 may be configured to detect peak position TFC such that the second loop 962 may find the best focal plane from a specimen surface.

In one embodiment, as a starting point, the first control loop 961 may adjust a stage assembly based on NSC optics and control feedback. Then, in cases where process variation exists (e.g., process variations induced by defocus from the first control loop 961), the second control loop 962 may detect focus error signals. The focus error signals may be calculated through a set of through focus images acquired via PMIQ optics and one or more detector assemblies. A control algorithm of the second loop 962 may calculate one or more focus metrics of PMIQ image at each focus offset to obtain a through focus curve or a few discrete points on a TFC. Measured TFC data points may be used to calculate the offset of the best focal plane of PMIQ with respect to the specimen surface at a current location. This offset corresponds to the focus error. This quantity is then converted into an NSC signal and may be fed back into the first control loop 961. Upon detecting focus error signals, the first control loop 961 may then move the stage assembly to a new z-position such that the focus error is fully corrected.

It is noted that the various steps 964-980 should not be interpreted as being limited to the particular order depicted in FIG. 9E or described herein. Rather, it is noted that the dual control loop 960 may start at any number of locations in the control loop 960 and bypass and/or repeat any number of steps.

In step 964, the first loop 961 utilizes one or more NSC optics to acquire one or more NSC signals. For example, the controller 921 of the AF system 900 may be configured to acquire the one or more NSC signals from the one or more NSC optics.

In step 966, the first loop 961 applies a first control algorithm (e.g., control algorithm 1) to the one or more NSC signals acquired in step 964.

In step 968, the first loop 961 adjusts a stage assembly based on the output of the first control algorithm (e.g., control algorithm 1). For example, the controller 921 of the AF system 900 may be configured to adjust the stage assembly 942. For instance, the stage assembly 942 may be adjusted in a z-direction.

It is noted herein that the first loop 961 of the dual control loop 960 may be configured as a feedback loop. The bandwidth of the first loop 961 may be adjusted based on the application of the control loop and/or one or more hardware selections. Further it is noted herein, when there is focus error, it is indicative of process variations. The magnitude of the focus error correlates to the severity of the process variation In step 970, the second loop 962 acquires one or more measurements using one or more PMIQ optics.

In step 972, the second loop 962 acquires a PMIQ through focus curve (TFC) via a detector assembly. For example, the one or more detectors 914*a*, 914*b* of the AF system 900 may acquire the PMIQ TFC. For instance, the TFC or the few discrete points on the TFC obtained via the PMIQ subsystem of step 970 may be used to generate the PMIQ TFC.

In step 974, the second loop 962 transfers data based on the PMIQ TFC. For example, the second loop 962 may be configured to transfer selected data via a data path to a selected destination for processing.

In step 976, the second loop 962 calculates a focus error and sign based on the data transferred. For example, the second loop 962 may calculate a focus error expressed as a distance (e.g., number of nanometers). It is noted that focus error is commonly measured in nanometers, while NSC counts represent an electronic digital signal which has linear relationship vs. focus error, corresponding to an S-curve slope in a linear region (FIG. 2A) of the data.

In a step 978, the second loop 962 passes data to the first loop 961 in NSC counts. In step 980, the second loop 962 applies a second control algorithm (e.g., control algorithm 2) to the data passed to the first loop 961. In this regard, the second loop 962 may convert the focus error into an NSC signal. Then, the second loop 962 may feed the NSC signal of the focus error into the first loop 961 of the dual control loop 960. The focus error may then be used by the first control loop 961 to adjust the z-position of the stage assembly to fully correct for the focus error.

The NSC autofocus routine and the PMIQ autofocus routine may be operated independently for 2D wafer inspection and non-array regions of 3D NAND wafer inspection. Further, the PMIQ autofocus routine may be operated independently where process variations are small and the required linear range is less than approximately 500 nm.

Figure 9F:
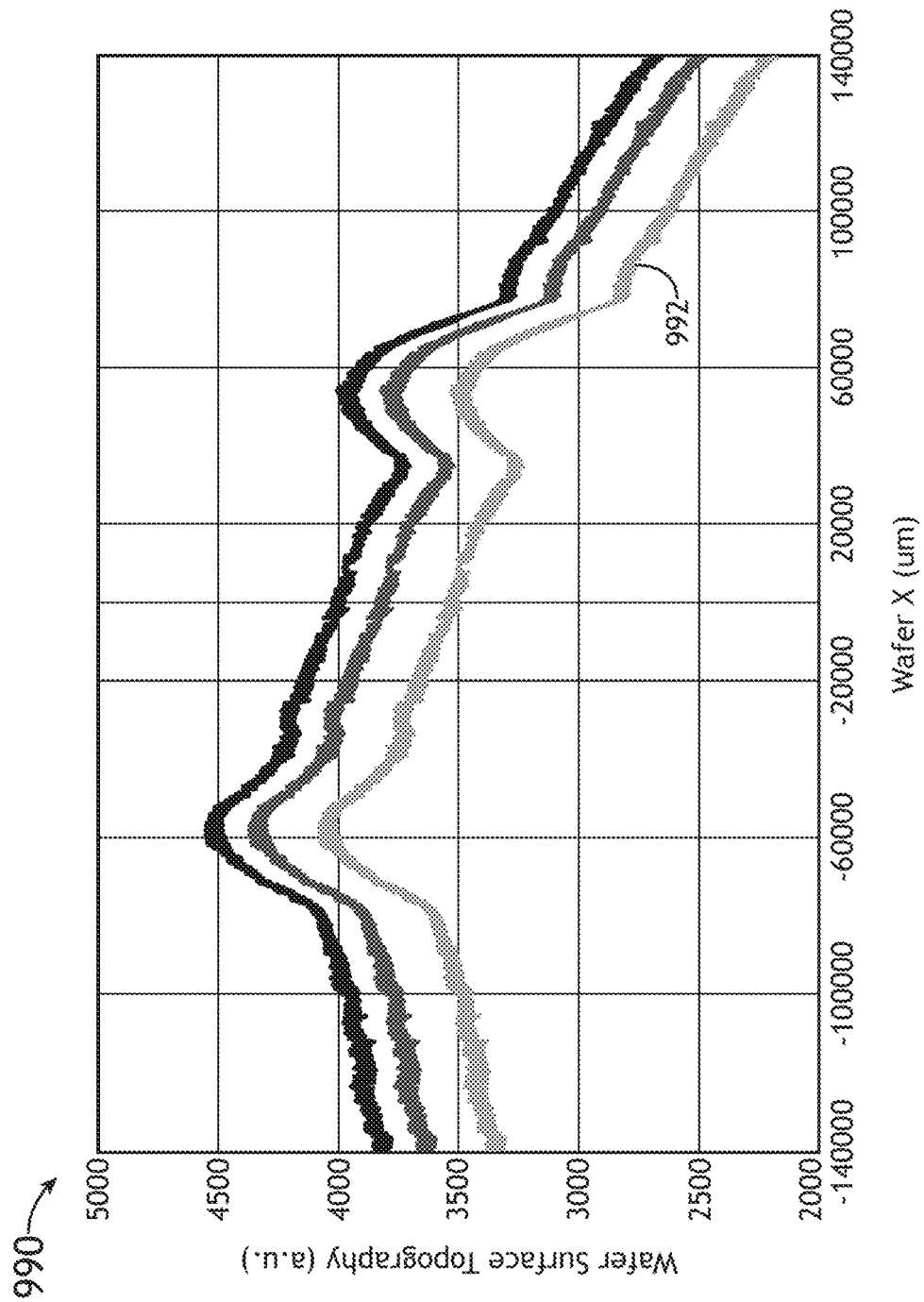
FIG. 9F illustrates a plot including an offset from a top surface of a specimen, in accordance with one or more embodiments of the present disclosure.

FIG. 9F illustrates a plot 990 including an offset from a top surface of a specimen, in accordance with one or more embodiments of the present disclosure.

It is noted herein that to inspect defects deeper in a specimen stack, a large focus offset is required. In one embodiment, the AF system 900 is configured to set a specimen at a user configurable focus offset conforming to a specimen top surface focus trajectory, which may be recorded during specimen surface inspection, as shown by the curve 992 in FIG. 9F.

In another embodiment, the AF system 900 may be configured to collect one or more focus error signals passed to the first loop 962 of the control loop 960. When there is focus error, it is indicative of process variations. Magnitude of focus error correlates with the severity of process variation. When a focus error map (FEM) is used in combination with a defect distribution map (e.g., FIG. 5), through correlation analysis of these two maps or with other process control parameters valuable information may be provided for users to find out the root cause of yield limiting factors.

In another embodiment, a focus error map (FEM) may be generated using the NSC projection system 905. Due to the focus sensitivity of NSC AF principle to process variations, defect distribution map is not very reliable. However, a focus error map can still include valuable information for users to identify yield limiting factors by correlating it with other process parameters.

It is noted herein that the NSC projection system 905 may be operated as a stand-alone AF system, which provides desirable functionality and excellent focus tracking performance for 2D wafer inspections and other non-array regions of 3D NAND wafer where PMIQ can be challenging but NSC AF principle works well. It is noted herein that the only difference from NSC AF is that it has reduced numerical aperture in both illumination and collection path in relation to the PMIQ projection system 903. This can increase focus tracking random noise. It can be mitigated by increasing a ratio of focus signal ($F_a$, $F_b$) to normal signal ($N_a$, $N_b$), which is 1:2 in NSC projection system 905. For example, the second beam splitter 928b may utilize a different splitting ratio from 50/50. For instance, the second beam splitter 928b may have a 66% transmission to focus channel and 33% reflection to normal channel. By way of another example, a neutral density filter may be used to reduce light in the normal channel.

Figure 10:
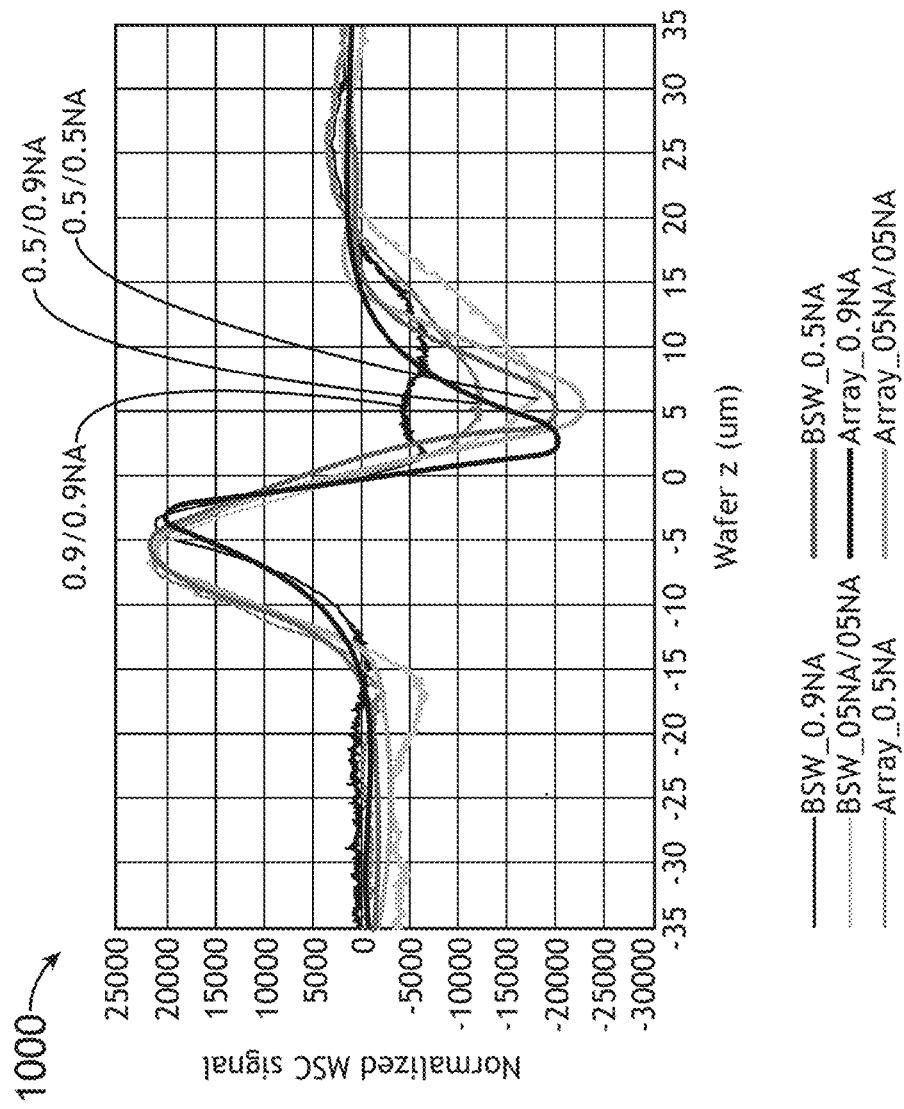
FIG. 10 illustrates an s-curve, in accordance with one or more embodiments of the present disclosure.

FIG. 10 illustrates an s-curve 1000, in accordance with one or more embodiments of the present disclosure.

As shown in FIG. 10, a linear range 1002 of the s-curve 1000 may be extended with a reduced NA setting in the NSC projection system 905 in relation to the PMIQ projection system 903 in both the illumination and collection pathway. For example, the linear range 1002 of the s-curve may be extended with a 0.5 NA setting in both the illumination and the collection pathway of the NSC projection system 905. The NSC projection system 905 may have a numerical aperture less than 0.9 NA. For example, the NSC projection system 905 may have a numerical aperture between 0.4-0.6 NA. For instance, the NSC projection system 905 may have a numerical aperture of 0.5 NA.

Figure 11:
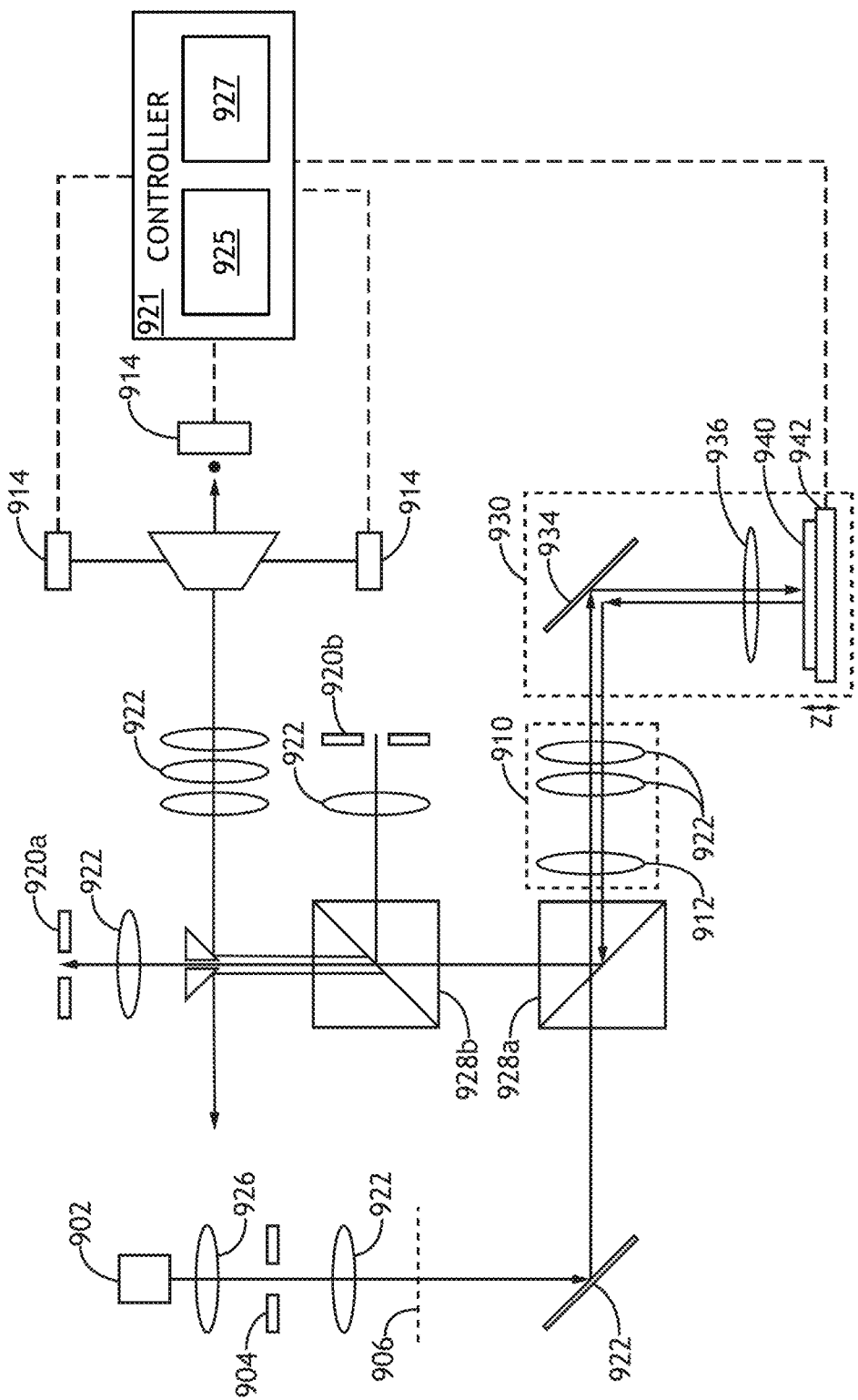
FIG. 11 illustrates an additional/alternative embodiment of the AF system, in accordance with one or more embodiments of the present disclosure.

FIG. 11 illustrates an additional/alternative embodiment of the AF system 900, in accordance with one or more embodiments of the present disclosure. In particular, the PMIQ projection system 903 of the AF system 900 may be implemented with different magnification than the NSC projection system 905. In this regard, the PMIQ projection system 903 and the NSC projection system 905 may share the same illumination with FOV splitting (e.g., as shown in FIG. 9B). Further, the PMIQ projection system 903 may have both leading/lagging with respect to the NSC projection system 905 for left-to-right and right-to-left scanning.

In addition, grid mask for the PMIQ projection system 903 field of view may be eliminated if a specimen's intrinsic pattern is resolvable with a 2D camera. In this regard, instead of detecting an externally projected pattern image quality, the specimen pattern's imaging quality is directly detected and analyzed. A similar control and focus metric algorithm can be applied in systems described previously herein. It is noted herein that focus metrics are not limited to edge slope. For example, robust contrast, cumulative density function (CDF), high frequency energy, or the like can be individually applied or in combination applied to determine a best focal plane.

Figure 12:
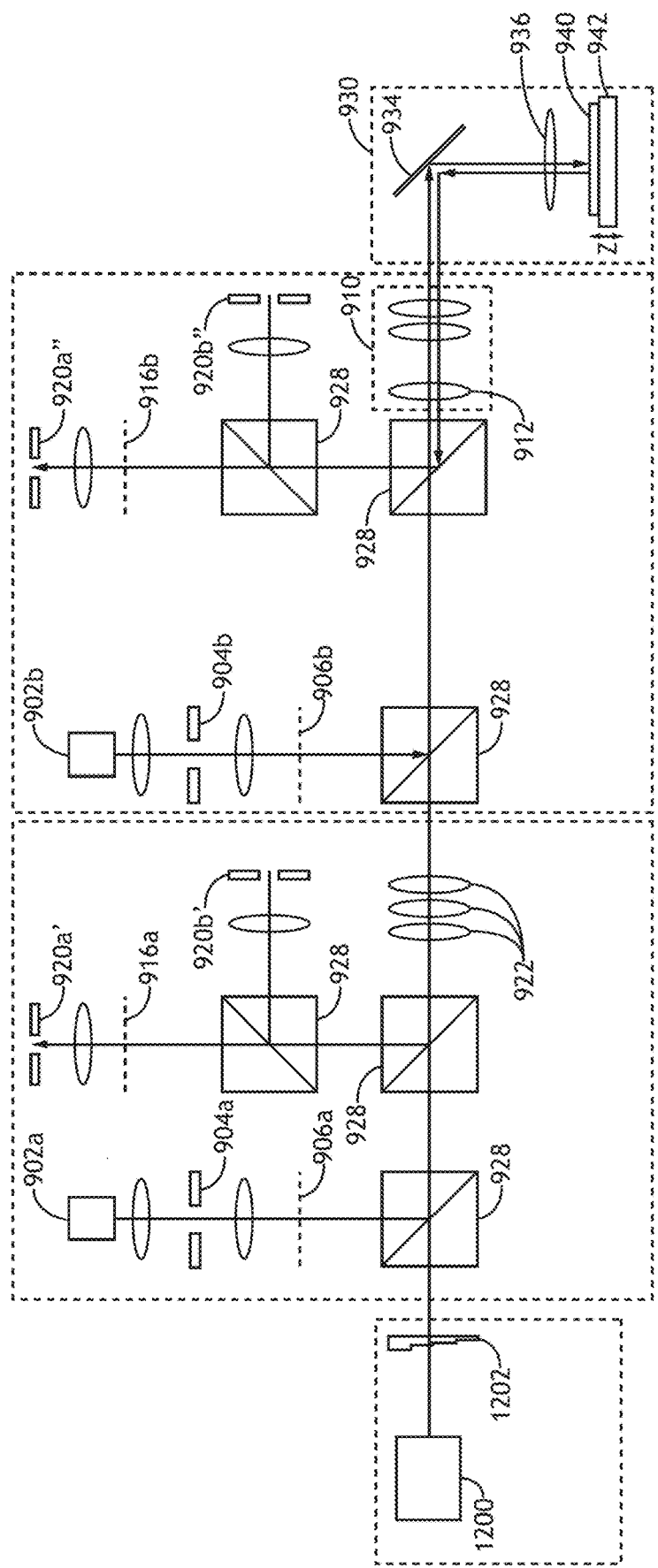
FIG. 12 illustrates a simplified schematic view of the AF system, in accordance with one or more embodiments of the present disclosure.

FIG. 12 illustrates an additional/alternative embodiment of the AF system 900, in accordance with one or more embodiments of the present disclosure. In particular, the low NA setting of the NSC projection system 905 may be configured for 3D NAND wafer surface tracking which is required to be insensitive to process variation. It is noted herein that this allows different magnification, independent aberration, and focus control of 2D and 3D inspection modules.

In one embodiment, the AF system 900 includes a detector 1200. For example, the AF system 900 may include a camera 1200. In another embodiment, the AF system 900 includes a step-wise focus delay 1202.

In another embodiment, the AF system 900 includes a plurality of focus sensors 920a', 920a". In another embodiment, the AF system 900 includes a plurality of normal sensors 920b', 920b".

Figure 13:
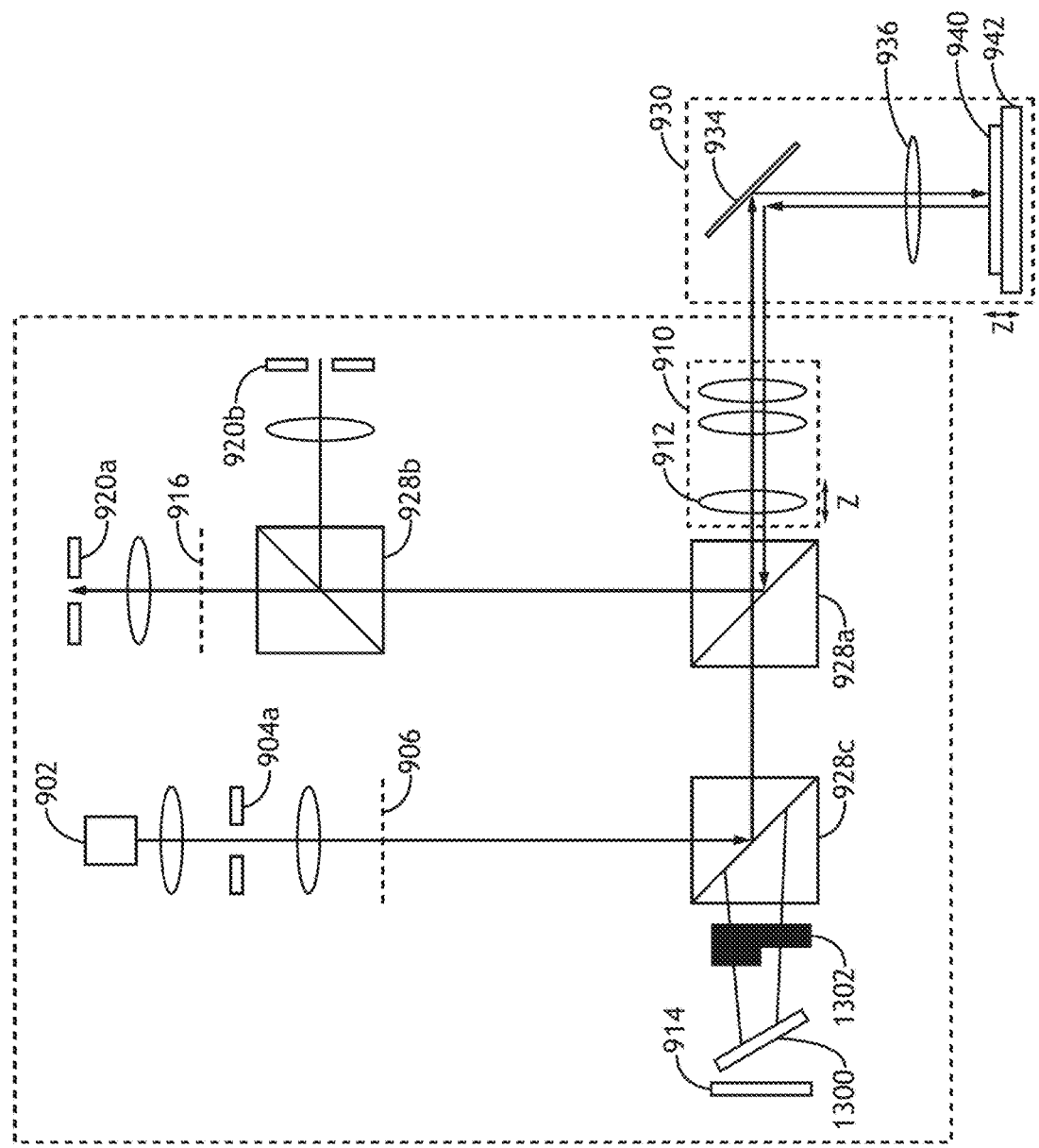
FIG. 13 illustrates a simplified schematic view of the AF system, in accordance with one or more embodiments of the present disclosure.

FIG. 13 illustrates an additional/alternative embodiment of the AF system 900, in accordance with one or more embodiments of the present disclosure. In particular, the PMIQ projection system 903 and the NSC projection system 905 of the AF system 900 may be configured to be run with similar NA settings. For example, the AF system 900 may be configured with the same NA through illumination transmitted through the one or more beam splitters.

In one embodiment, the AF system 900 includes a tilted camera 1300. In another embodiment, the AF system 900 includes a transparent plate 1302 disposed in front of the detector assembly 914. The transparent plate 1302 may be formed of any transparent material known in the art including, but not limited to, glass.

In this embodiment, the illumination source 902 may include a light emitting diode (LED) illumination source 902.

FIG. 14 illustrates exemplary project mask patterns 1400, in accordance with one or more embodiments of the present disclosure.

In one embodiment, the projection mask pattern 1400 includes a line space pattern 1402. In another embodiment, the projection mask pattern 1400 includes a square (or rectangular) box pattern 1404. In another embodiment, the projection mask pattern 1400 includes a star pattern 1406. It is noted herein that the projection mask pattern 1400 may include any specially designed pattern, therefore the above discussion should not be construed as a limitation on the scope of the present disclosure.

In another embodiment, the projection mask pattern 1400 may include a grid mask pattern configured to enhance focus detection sensitivity. For instance, a series of binary square boxes oriented at different angles with respect to the specimen x-axis can allow for detection of imaging quality with more information on different aberration types. It is noted herein that the grid mask's imaging contrast can be enhanced by applying a special coating or altering the material design of transmission and blocking a property of bright and dark portions of the mask.

It is noted herein that the AF system 800, 900, 1100, 1200, 1300 may have a number of advantages over the AF system 100. For example, the AF system can track specimen surface with process variation and un-patterned regions. For instance, the specimen surface plane determined with the AF system 800 is insensitive to process variation and un-patterned regions in an array. In this regard, surface defect detection sensitivity can achieve full entitlement of the high-performance imaging system (e.g., imaging system 830). By way of another example, the AF system has an increased ability to detect defocus errors. For instance, when testing the AF system on a 3D NAND wafer with an AF at 0.9 NA, the defocus error of was detected at 40 nm which is well within one depth of focus.

By way of another example, the NSC projection system 905 has extended s-curve linear range by using a reduced numerical aperture in both illumination and collection pathways. This extended linear range can avoid loss of focus which is typical when the pervious methods set the NA at 0.9 NA for both illumination and collection apertures. As shown in FIG. 10, nominal symmetrical s-curve becomes mis-shaped in the bottom half. The s-curve linear range may be reduced dramatically, and thus is easy to lose focus.

By way of another example, an extended s-curve linear range is also a critical design scheme to enable feeding NSC signal based focus errors into the control algorithm 2 of the dual control loop 960 shown in FIG. 9E. By way of another example, a split field of view can avoid cross-talk between one or more components of the AF system. By way of another example, the control loops of the one or more components may be operated independently for 2D wafer inspection and non-array region 3D NAND wafer inspection. For example, a PMIQ control loop can be operated independently.

By way of another example, a through focus curve (TFC) can be alternatively obtained with a tilted 2D camera without moving specimen z stage or other moving parts in optical system, which otherwise potentially introduces vibrations, air wiggles, and/or acoustic noises. By way of a further example, a through focus curve (TFC) can be alternatively obtained with a set of glass plates with different thickness without moving wafer z stage or other moving parts in optical system, which otherwise can potentially introduce vibrations, air wiggles, and/or acoustic noises.

By way of a further example, an AF field of view on a specimen plane can be digitally truncated when a smaller size is required. In addition, unwanted specimen features which potentially interferes PMIQ detection can also be digitally masked out. Further, the NSC curve of the AF system 100 can be computationally generated with either energy-based method or edge motion-based method.

By way of another example, for bottom defect detection, the specimen can be set at a user configurable focus offset with respect to a specimen surface topography, which is recorded during surface defect inspections. It is noted that the PMIQ approach and/or the PMIQ+NSC approach works very well to track array region wafer surface for 3D NAND inspection. However, when inspecting defects at the bottom of a wafer stack or at large focus offset, a different strategy can be used to alleviate excessive travel range requirement for focus lens in the NSC approach. In this alternative approach, one can record down z stage z0(x, y) during inspection at a wafer surface. For wafer bottom or large focus offset inspection, we use a constant user configurable focus offset can be added such that, for inspection at large focus offset, autofocus tracks to a virtual plane with a constant offset from a top surface as shown in FIG. 9F.

By way of a further example, a focus error map (FEM) can be collected during inspection. Further, a focus error map can be collected prior to inspection. The FEM can be valuable for users to find out process variation root causes and/or yield limiting factors.

It is noted herein that the one or more components of system 800, 900 may be communicatively coupled to the various other components of system 800, 900 in any manner known in the art. For example, the one or more processors 818, 925 may be communicatively coupled to each other and other components via a wireline (e.g., copper wire, fiber optic cable, and the like) or wireless connection (e.g., RF coupling, IR coupling, WiMax, Bluetooth, 3G, 4G, 4G LTE, 5G, and the like). By way of another example, the controller 816, 921 may be communicatively coupled to one or more components of the system 800, 900 via any wireline or wireless connection known in the art.

In one embodiment, the one or more processors 818, 925 may include any one or more processing elements known in the art. In this sense, the one or more processors 818, 925 may include any microprocessor-type device configured to execute software algorithms and/or instructions. In one embodiment, the one or more processors 818, 925 may consist of a desktop computer, mainframe computer system, workstation, image computer, parallel processor, or other computer system (e.g., networked computer) configured to execute a program configured to operate the system 800, 900, as described throughout the present disclosure. It should be recognized that the steps described throughout the present disclosure may be carried out by a single computer system or, alternatively, multiple computer systems. Furthermore, it should be recognized that the steps described throughout the present disclosure may be carried out on any one or more of the one or more processors 818, 925. In general, the term "processor" may be broadly defined to encompass any device having one or more processing elements, which execute program instructions from memory 820, 927. Moreover, different subsystems of the system 800, 900 may include processor or logic elements suitable for carrying out at least a portion of the steps described throughout the present disclosure. Therefore, the above description should not be interpreted as a limitation on the present disclosure but merely an illustration.

The memory 820, 927 may include any storage medium known in the art suitable for storing program instructions executable by the associated one or more processors 818, 925 and the data received from the system 800, 900. For example, the memory 820, 927 may include a non-transitory memory medium. For instance, the memory 820, 927 may include, but is not limited to, a read-only memory (ROM), a random-access memory (RAM), a magnetic or optical memory device (e.g., disk), a magnetic tape, a solid-state drive and the like. It is further noted that memory 820, 927 may be housed in a common controller housing with the one or more processors 818, 925. In an alternative embodiment, the memory 820, 927 may be located remotely with respect to the physical location of the processors 818, 925, controller 816, 921, and the like. In another embodiment, the memory 820, 927 maintains program instructions for causing the one or more processors 818, 925 to carry out the various steps described through the present disclosure.

In one embodiment, a user interface is communicatively coupled to the controller 816, 921. In one embodiment, the user interface may include, but is not limited to, one or more desktops, tablets, smartphones, smart watches, or the like. In another embodiment, the user interface includes a display used to display data of the system 800, 900 to a user. The display of the user interface may include any display known in the art. For example, the display may include, but is not limited to, a liquid crystal display (LCD), an organic light-emitting diode (OLED) based display, or a CRT display. Those skilled in the art should recognize that any display device capable of integration with a user interface is suitable for implementation in the present disclosure. In another embodiment, a user may input selections and/or instructions responsive to data displayed to the user via a user input device of the user interface.

One skilled in the art will recognize that the herein described components (e.g., operations), devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components (e.g., operations), devices, and objects should not be taken as limiting.

Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary.

The previous description is presented to enable one of ordinary skill in the art to make and use the invention as provided in the context of a particular application and its requirements. As used herein, directional terms such as "top," "bottom," "over," "under," "upper," "upward," "lower," "down," and "downward" are intended to provide relative positions for purposes of description, and are not intended to designate an absolute frame of reference. Various modifications to the described embodiments will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

[own] With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

All of the methods described herein may include storing results of one or more steps of the method embodiments in memory. The results may include any of the results described herein and may be stored in any manner known in the art. The memory may include any memory described herein or any other suitable storage medium known in the art. After the results have been stored, the results can be accessed in the memory and used by any of the method or system embodiments described herein, formatted for display to a user, used by another software module, method, or system, and the like. Furthermore, the results may be stored "permanently," "semi-permanently," temporarily," or for some period of time. For example, the memory may be random access memory (RAM), and the results may not necessarily persist indefinitely in the memory.

It is further contemplated that each of the embodiments of the method described above may include any other step(s) of any other method(s) described herein. In addition, each of the embodiments of the method described above may be performed by any of the systems described herein.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected," or "coupled," to each other to achieve the desired functionality, and any two components capable of being so associated can also be viewed as being "couplable," to each other to achieve the desired functionality. Specific examples of couplable include but are not limited to physically mateable and/or physically interacting components and/or wirelessly interactable and/or wirelessly interacting components and/or logically interacting and/or logically interactable components.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," and the like). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, and the like" is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, and the like). In those instances where a convention analogous to "at least one of A, B, or C, and the like" is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, and the like). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. An auto-focusing system comprising:
    a projection mask image quality (PMIQ) auto-focusing system comprising:
        an illumination source;
        a first aperture;
        a first projection mask; and
        a first PMIQ detector assembly and a second PMIQ detector assembly;
    a normalized s-curve (NSC) auto-focusing system comprising:
        an illumination source;
        a second aperture;
        a second projection mask; and
        a first NSC detector assembly and a second NSC detector assembly;
    a relay system, wherein the relay system is configured to optically couple illumination from the PMIQ autofocusing system and the NSC auto-focusing system to an imaging system,
    wherein the relay system is configured to project one or more patterns from the first projection mask onto a specimen disposed on a stage assembly of the imaging system and transmit an image of the first projection mask from the specimen to the first PMIQ detector assembly and the second PMIQ detector assembly,
    wherein the relay system is configured to project one or more patterns from the second projection mask onto the specimen disposed on the stage assembly of the imaging system and transmit an image of the second projection mask from the specimen to the first NSC detector assembly and the second NSC detector assembly; and
    a controller including one or more processors, wherein the one or more processors are configured to execute a set of program instructions stored in non-transitory memory, wherein the program instructions are configured to cause the one or more processors to:
        receive one or more signals from the first PMIQ detector assembly, the second PMIQ detector assembly, the first NSC detector assembly, and the second NSC detector assembly; and
        execute a dual control loop based on the one or more signals from the first PMIQ detector assembly, the second PMIQ detector assembly, the first NSC detector assembly, and the second NSC detector assembly to adjust the stage assembly to maintain focus of the imaging system.

2. The system of claim 1, wherein the first projection mask and the second projection mask are positioned such that the first projection mask is projected in a first half of a field of view and the second projection mask is projected in a second half of the field of view to mitigate optical cross-talk between the PMIQ autofocusing system and the NSC autofocusing system.

3. The system of claim 2, wherein at least one of a grid mask pattern, a grid mask pitch, or a grid mask orientation of the first projection mask is different from the second projection mask.

4. The system of claim 1, wherein the illumination source of the PMIQ autofocusing system is configured to operate in a continuous ON-state.

5. They system of claim 1, wherein the illumination source of the NSC autofocusing system includes a first illumination channel and a second illumination channel, wherein an output of the illumination source of the NSC autofocusing system is time-multiplexed to mitigate cross-talk between the first illumination channel and the second illumination channel.

6. The system of claim 1, wherein the NSC autofocusing system has a reduced numerical aperture relative to the PMIQ autofocusing system in at least one of an illumination pathway or a collection pathway.

7. The system of claim 6, wherein the NSC autofocusing system has an extended s-curve linear range.

8. The system of claim 6, wherein the NSC autofocusing system has a numerical aperture less than 0.9 NA.

9. The system of claim 8, wherein the NSC autofocusing system has a numerical aperture between 0.4 to 0.6 NA.

* * * * *